US007729149B2

(12) United States Patent
Thummalapally

(10) Patent No.: US 7,729,149 B2
(45) Date of Patent: Jun. 1, 2010

(54) CONTENT ADDRESSABLE MEMORY CELL INCLUDING A JUNCTION FIELD EFFECT TRANSISTOR

(75) Inventor: Damodar R. Thummalapally, Milpitas, CA (US)

(73) Assignee: SuVolta, Inc., Los Gatos, CA (US)

( * ) Notice: Subject to any disclaimer, the term of this patent is extended or adjusted under 35 U.S.C. 154(b) by 413 days.

(21) Appl. No.: 11/799,305

(22) Filed: May 1, 2007

(65) Prior Publication Data
US 2008/0272405 A1 Nov. 6, 2008

(51) Int. Cl.
G11C 15/00 (2006.01)
(52) U.S. Cl. .................... 365/49.1; 365/49.17; 365/174
(58) Field of Classification Search ................ 365/49.1, 365/184, 49.17, 174; 711/108; 257/272
See application file for complete search history.

(56) References Cited

U.S. PATENT DOCUMENTS

| 3,964,083 | A | | 6/1976 | Lohstroh | |
|---|---|---|---|---|---|
| 6,166,938 | A | * | 12/2000 | Wong | 365/49.1 |
| 6,262,907 | B1 | * | 7/2001 | Lien et al. | 365/49.12 |
| 6,307,223 | B1 | * | 10/2001 | Yu | 257/256 |
| 7,115,933 | B2 | * | 10/2006 | Menut et al. | 257/301 |
| 7,196,921 | B2 | * | 3/2007 | Sarin et al. | 365/49.17 |
| 7,633,784 | B2 | * | 12/2009 | Thummalapally | 365/49.12 |
| 2007/0096144 | A1 | * | 5/2007 | Kapoor | 257/134 |
| 2008/0001183 | A1 | * | 1/2008 | Kapoor | 257/256 |
| 2008/0265936 | A1 | * | 10/2008 | Vora | 326/41 |
| 2008/0273409 | A1 | * | 11/2008 | Thummalapally | 365/222 |
| 2008/0285322 | A1 | * | 11/2008 | Thummalapally | 365/49.12 |

OTHER PUBLICATIONS

Bedair, Wissenam, and Cooper, "Atomic Layer Epitaxy of Advanced Devices and Circuits," Final Report submitted to Office of Naval Research N00014-88-K-0527P3. Nov. 1991. pp. 1-63.*
Oldham et al., A One-Transistor Memory Cell with Nondestructive Readout, IEEE International Solid-State Circuits Conference, Feb. 14, 1973, pp. 34-35, and 195.
Heald et al., Multilevel Random-Access Memory Using One Transistor Per Cell, IEEE Journal of Solid-State Circuits, Aug. 1976, pp. 519-528 vol. SC11, No. 4.
PCT International Search Report and Written Opinion of the International Searching Authority for International Application No. PCT/US2008/061946, dated Aug. 5, 2008.

* cited by examiner

Primary Examiner—Dang T Nguyen
Assistant Examiner—Alexander Sofocleous
(74) Attorney, Agent, or Firm—Darryl G. Walker

(57) ABSTRACT

A semiconductor device that includes a memory cell having a junction field effect transistor (JFET) used to form a content addressable memory (CAM) cell is disclosed. The JFET may include a data storage region disposed between a first and second insulating region. The data storage region provides a first threshold voltage to the JFET when storing a first data value and provides a second threshold voltage to the JFET when storing a second data value. The memory cell is a dynamic random access memory (DRAM) cell and can be used to form a CAM cell. The CAM cell may be a ternary CAM cell formed with as few as two JFETs.

21 Claims, 22 Drawing Sheets

|         | Vg     | Vd     | Vs           | Vwell |
|---------|--------|--------|--------------|-------|
| Erase   | 0.4 V  | -0.3 V | 0 V or -0.3 V | 0.5 V |
| Program | -0.9 V | 0.5 V  | 0 V or 0.5 V  | 0.5 V |
| Read    | 0.2 V  | 0.1 V  | 0.0 V        | 0.5 V |
| Refresh | 0.0 V  | 0.5 V  | 0 V or 0.5 V  | 0.5 V |

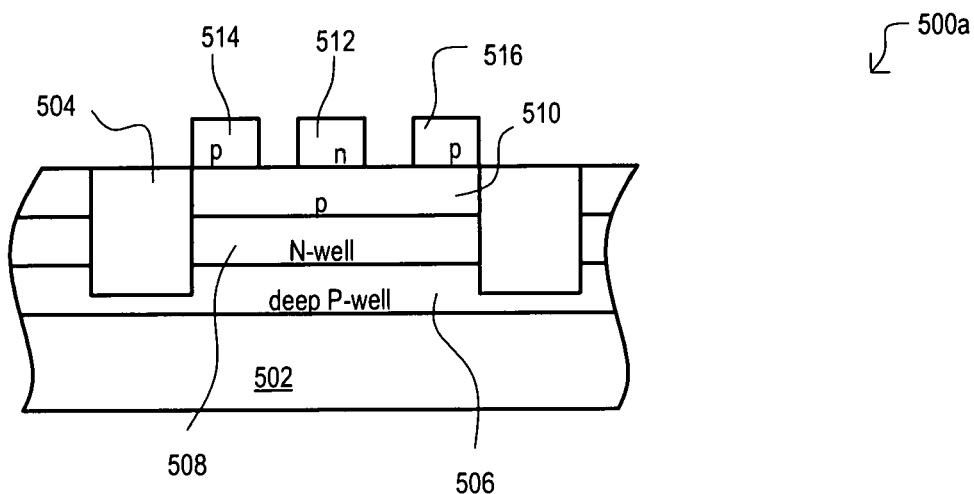
FIG. 5A
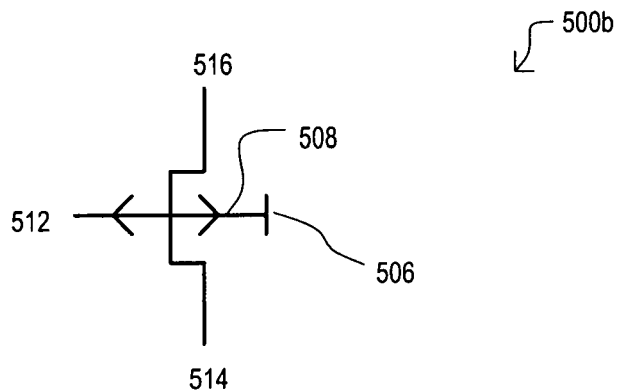
FIG. 5B
|  | Vg | Vd | Vs | Vwell |
|---|---|---|---|---|
| Erase | 0.1 V | 0.8 V | 0.5 V or 0.8 V | 0.0 V |
| Program | 1.4 V | 0.0 V | 0.5 V or 0.0 V | 0.0 V |
| Read | 0.3 V | 0.4 V | 0.5 V | 0.0 V |
| Refresh | 0.5 V | 0.0 V | 0.5 V or 0.0 V | 0.0 V |
FIG. 6

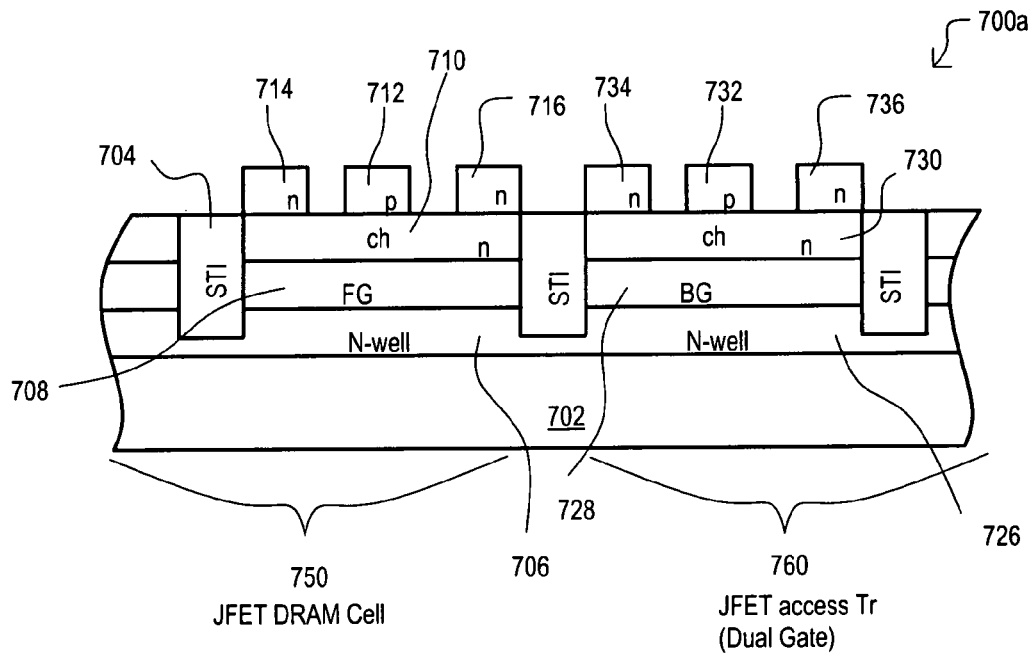
FIG. 7A
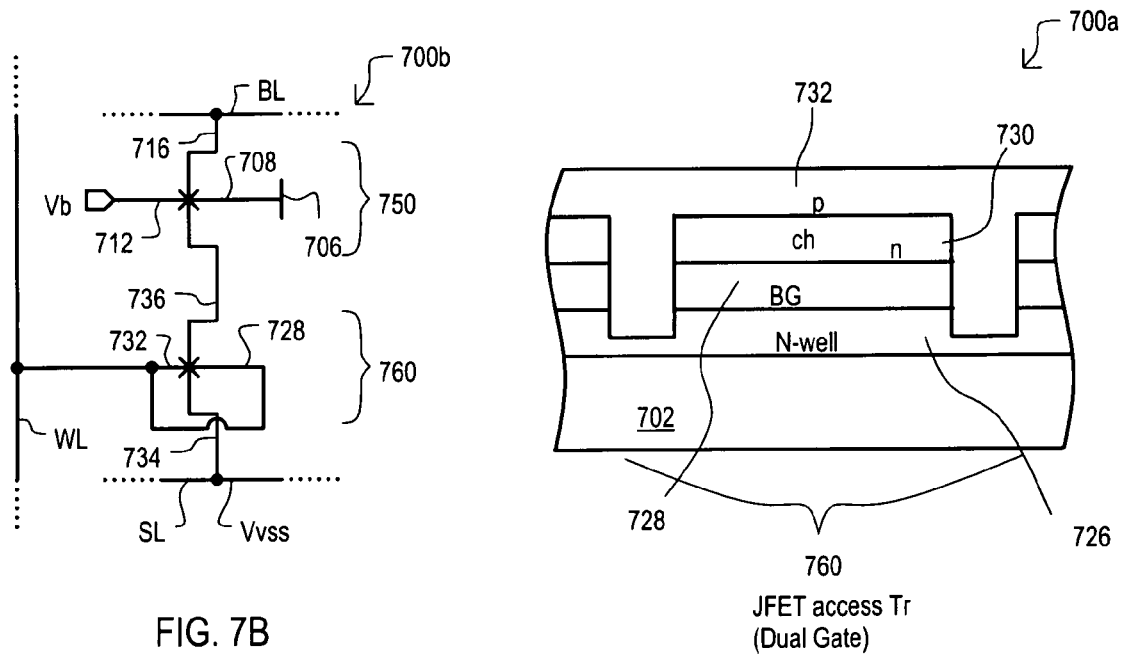
FIG. 7B
FIG. 7C

|  | WL | BL | Vb | Vvss | Vth |
|---|---|---|---|---|---|
| Erase | -0.3 V or 0.0 V | 0.0 V | 0.4 V | -0.3 V | -0.4 V |
| Program | 0.7 V | 0.0 V or 0.5 V | -1.0 V | 0.0 V or 0.5 V | 0.4 V |
| Read | 0.5 V or 0.0 V | Sense Node | 0.2 V | Sense Node | |
| Refresh | | | 0.0 V | | |

FIG. 8

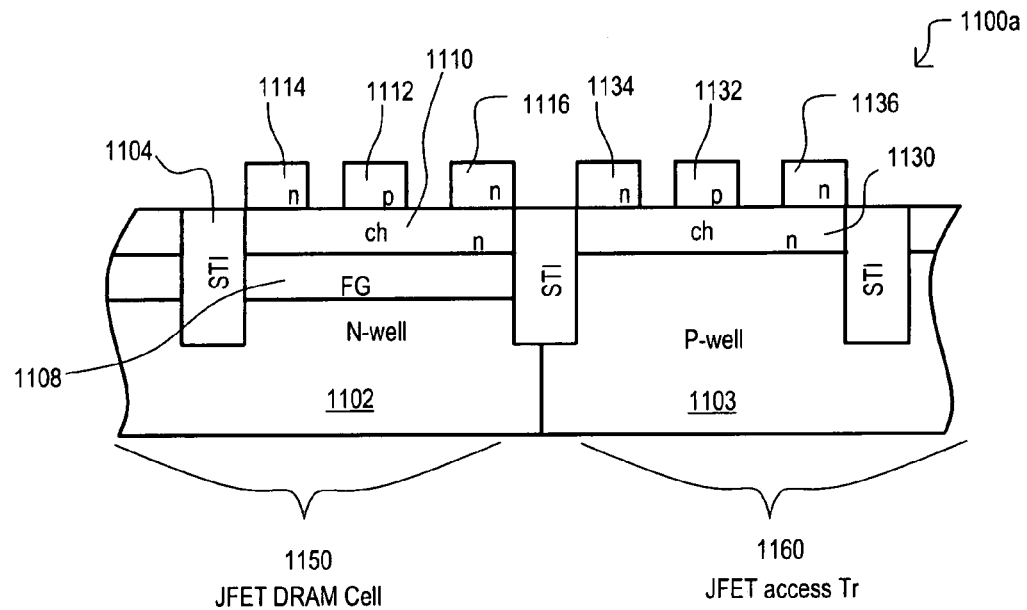
FIG. 11A
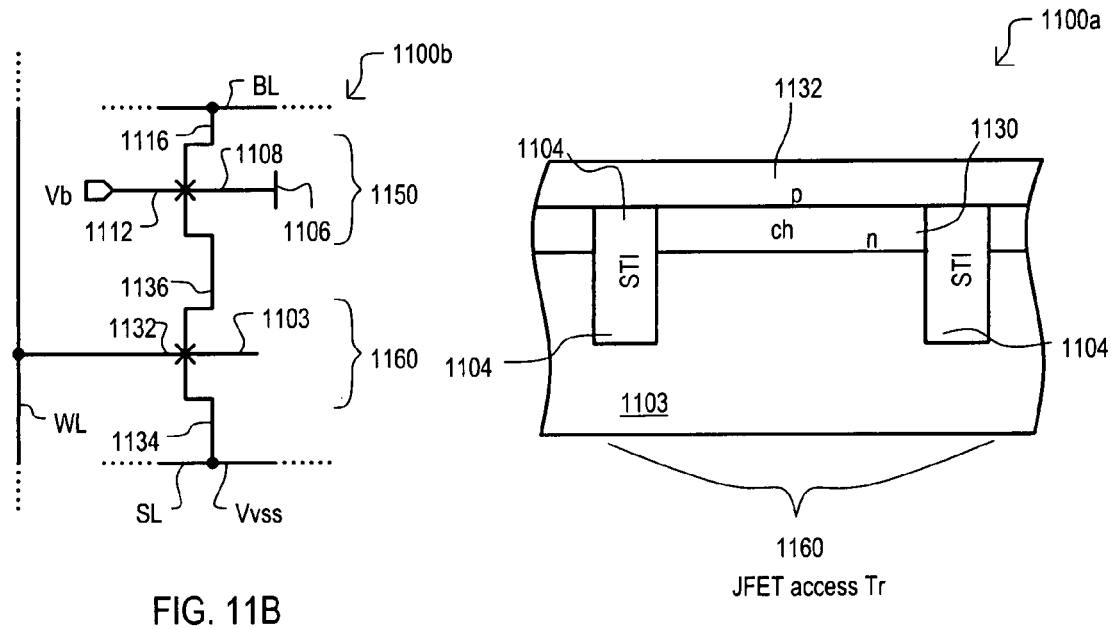
FIG. 11B
FIG. 11C

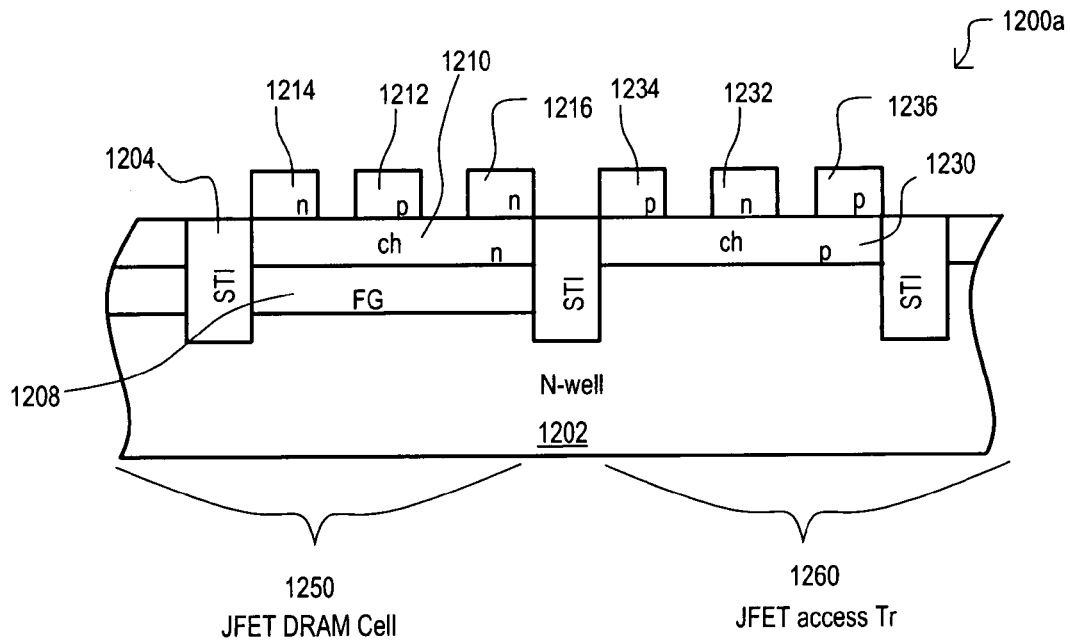
FIG. 12A
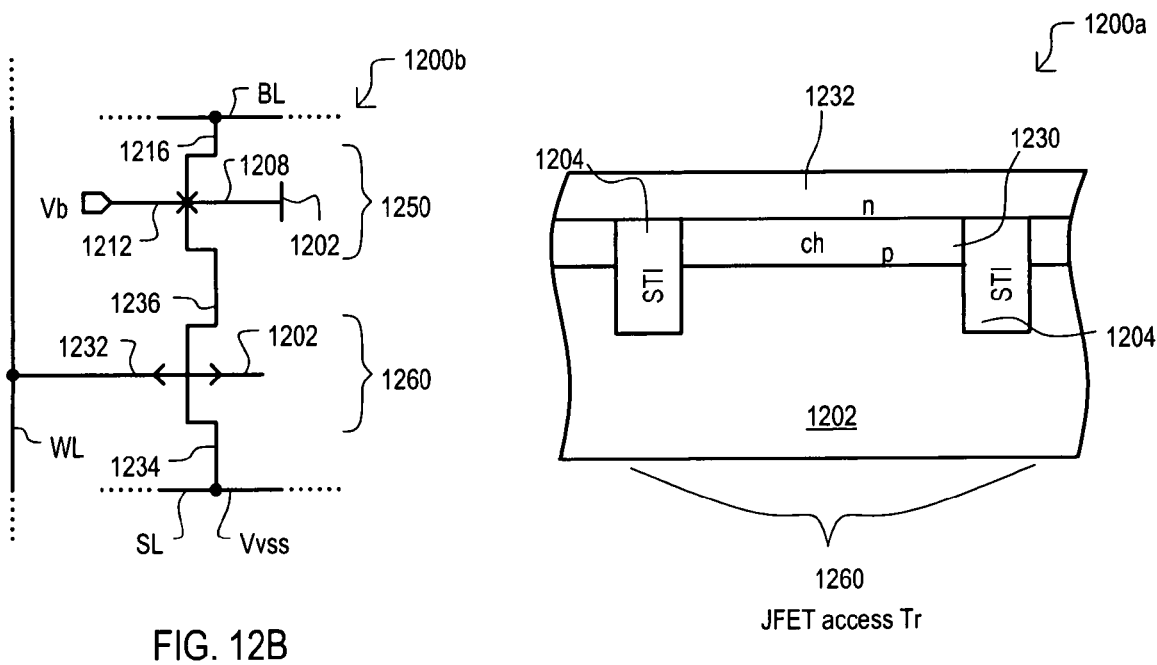
FIG. 12B
FIG. 12C

| Memory | | Input search key data | Match output |
|---|---|---|---|
| X-Cell Value | Y-Cell Value | CD/CDN | Match (ML) |
| 0 | 1 | 0/1 | hit |
| 0 | 1 | 1/0 | miss |
| 1 | 0 | 0/1 | miss |
| 1 | 0 | 1/0 | hit |
| 1 | 1 | Don't care | hit |
| 0 | 0 | 0/0 | hit |
| 0 | 0 | 0/1 | miss |
| 0 | 0 | 1/0 | miss |
| Don't care | Don't care | 0/0 | hit |

| | Vg | Vd | Vs | Vwell |
|---|---|---|---|---|
| Erase | 0.4 V | -0.3 V | 0.0 V or -0.3 V | 0.5 V |
| Program | -1.0 V | 0.5 V | 0.0 V or 0.5 V | 0.5 V |
| Read | 0.5 V | 0.1 V | 0.0 V | 0.5 V |
| Soft Program | 0.0 V | 0.0 V | 0.0 V | 0.5 V |

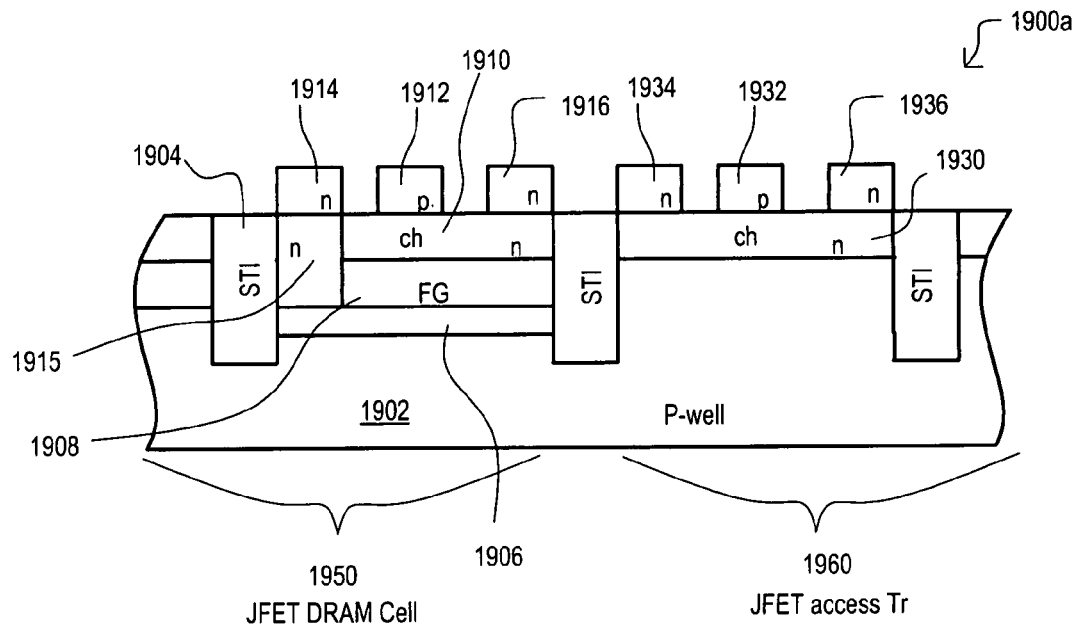
FIG. 19A
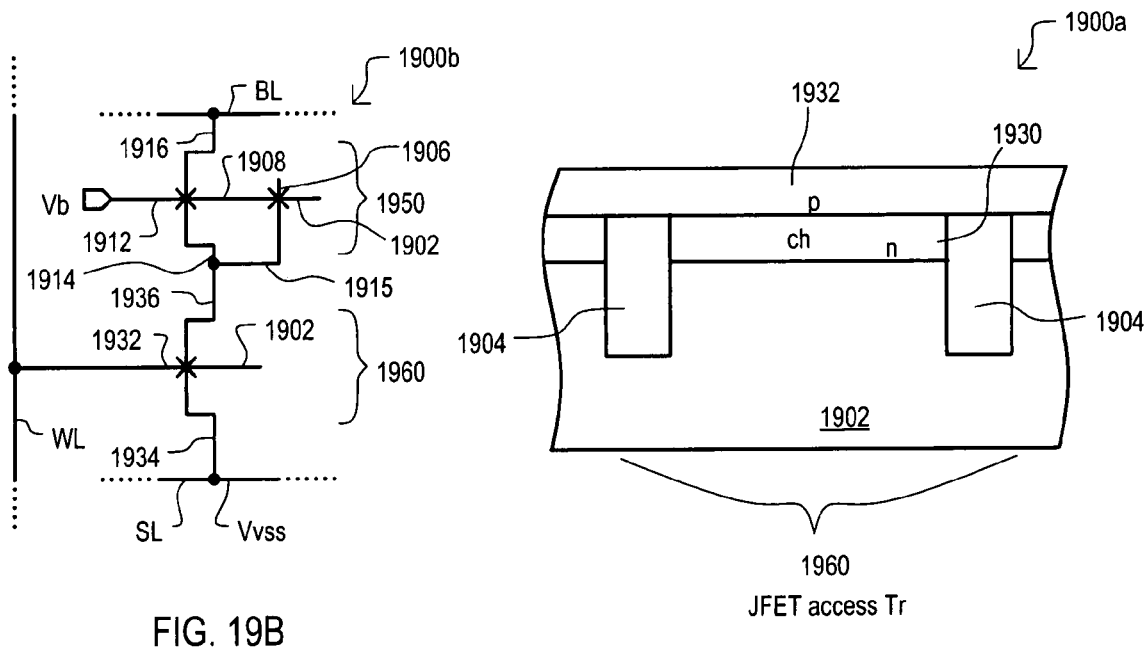
FIG. 19B
FIG. 19C

US 7,729,149 B2

CONTENT ADDRESSABLE MEMORY CELL INCLUDING A JUNCTION FIELD EFFECT TRANSISTOR

TECHNICAL FIELD

The present invention relates generally to semiconductor devices, and more particularly to a junction field effect transistor content addressable memory (CAM) cell.

BACKGROUND OF THE INVENTION

A typical dynamic random access memory (DRAM) cell includes a metal-oxide-semiconductor field effect transistor (MOSFET) and a capacitor. The MOSFET is used as a pass transistor to allow charge to be transferred to and from a capacitor used to store data.

A DRAM cell using a junction field effect transistor having a buried gate used to store charge is disclosed in Heald et al., "Multilevel Random-Access Memory Using One Transistor Per Cell," *IEEE Journal of Solid-State Circuits*, Vol. SC-11, No. 4, pp. 519-528, August 1979, the contents of which are incorporated herein. The buried gate in Heald et al. is a n-type diffusion buried inside a p-type region so that the buried gate is surrounded on all sides by the p-type region. Such a structure can require an implant mask during the formation of the n-type buried gate. Such a mask may need proper alignment, particularly as minimum dimensions of the DRAM become deep sub-micron.

SUMMARY OF THE INVENTION

According to the present embodiment, a semiconductor device may include a content addressable memory (CAM) cell. The CAM cell may include a first junction field effect transistor (JFET) coupled between a match line and a source line.

The JFET can include a data storage region that may provide a threshold voltage to the JFET in accordance with a data value stored thereon.

BRIEF DESCRIPTION OF THE DRAWINGS

FIG. 5A is a cross-section diagram of a JFET DRAM cell according to an embodiment.

FIG. 5B is a circuit schematic diagram showing the configuration for an array of JFET DRAM cells according to an embodiment.

FIG. 6 is a table illustrating the voltages applied to the terminals of a JFET DRAM for various operations according to an embodiment.

FIG. 7A is a cross-sectional diagram of a TTJFET DRAM cell utilizing a JFET DRAM cell according to an embodiment.

FIG. 7B is a circuit schematic diagram of a TTJFET DRAM cell utilizing a JFET DRAM cell according to an embodiment.

FIG. 7C is a cross-sectional diagram of a TTJFET DRAM cell utilizing a JFET DRAM cell according to an embodiment.

FIG. 8 is a table indicating the voltages applied to a TTJFET DRAM cell during various modes of operation according to an embodiment.

FIG. 11A is a cross-sectional diagram of a TTJFET DRAM cell utilizing a JFET DRAM cell according to an embodiment.

FIG. 11B is a circuit schematic diagram of a TTJFET DRAM cell utilizing a JFET DRAM cell according to an embodiment.

FIG. 11C is a cross-sectional diagram of a TTJFET DRAM cell utilizing a JFET DRAM cell according to an embodiment.

FIG. 12A is a cross-sectional diagram of a TTJFET DRAM cell utilizing a JFET DRAM cell according to an embodiment.

FIG. 12B is a circuit schematic diagram of a TTJFET DRAM cell utilizing a JFET DRAM cell according to an embodiment.

FIG. 12C is a cross-sectional diagram of a TTJFET DRAM cell utilizing a JFET DRAM cell according to an embodiment.

FIG. 19A is a cross-sectional diagram of a TTJFET DRAM cell utilizing a JFET DRAM cell according to an embodiment.

FIG. 19B is a circuit schematic diagram of a TTJFET DRAM cell utilizing a JFET DRAM cell according to an embodiment.

FIG. 19C is a cross-sectional diagram of a TTJFET DRAM cell utilizing a JFET DRAM cell according to an embodiment.

DETAILED DESCRIPTION OF THE EMBODIMENTS

Various embodiments of the present invention will now be described in detail with reference to a number of drawings. The embodiments show a junction field effect transistor (JFET) dynamic random access memory cell and applications therefore.

Figure 1A:
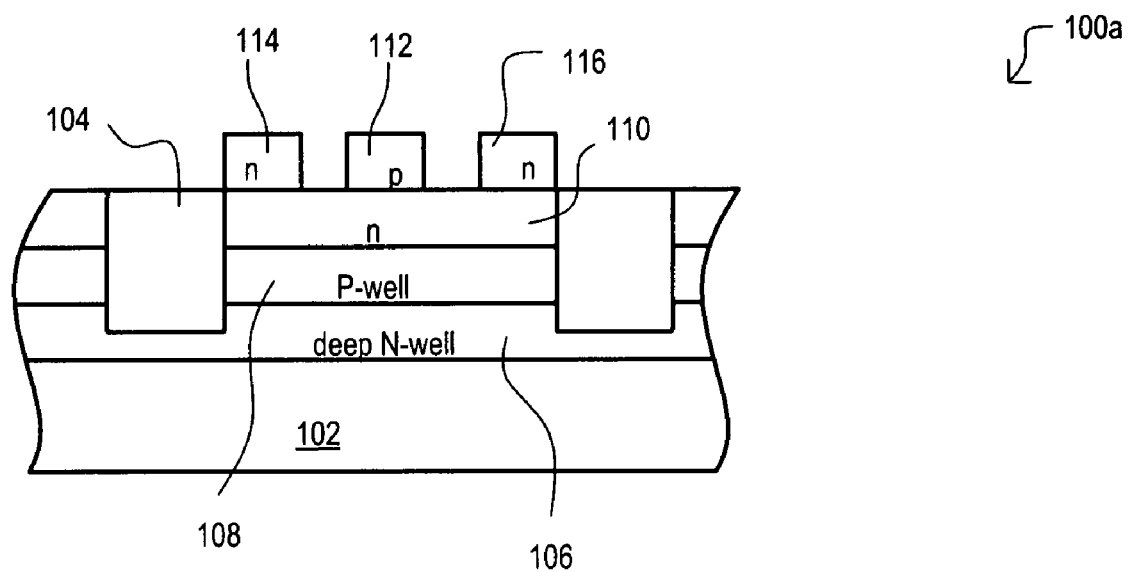
FIG. 1A is a cross-sectional diagram of a JFET dynamic random access memory (DRAM) cell according to an embodiment.

Referring now to FIG. 1A, a cross-sectional diagram of a JFET dynamic random access memory (DRAM) cell according to an embodiment is set forth and given the general reference character 100a. JFET DRAM cell 100a is an n-channel JFET DRAM cell. JFET DRAM cell 100a can be formed on a semiconductor substrate 102.

JFET DRAM cell 100a is formed between two isolation regions 104. Isolation regions 104 can be formed with a shallow trench isolation (STI) method or the like. JFET DRAM cell 100a can include a deep n-type well 106 formed on a semiconductor substrate 102. A data storing region 108 can be formed on the deep n-type well 106. The data storing region 108 can be formed by a p-well. A channel region 110 can be formed on the data storing region 108. The channel region 110 can be a n-type doped region. JFET DRAM cell 100a can include a source terminal 114, a gate terminal 112, and a drain terminal 116. The source terminal 114 and drain terminal 116 can be formed from a n-type polysilicon layer and the gate terminal 112 can be formed from a p-type polysilicon layer. The deep n-type well 106 can be electrically connected to a deep n-type well terminal (not shown) so that an electrical bias may be connected to the deep n-type well 106.

The polysilicon layer that forms gate terminal 112 can be used as a word line, for example. A bit line may be connected to the drain terminal 116. The bit line and word line can be orthogonal to each other. In this way, a bit line can connect a column of like JFET DRAM cells 100a and a word line can connect a row of like JFET DRAM cells 100a.

Figure 1B:
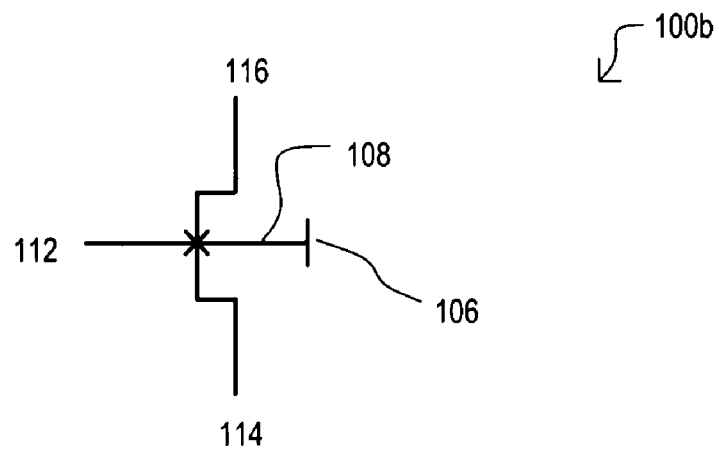
FIG. 1B is a circuit schematic diagram of JFET DRAM cell according to an embodiment.

Referring now to FIG. 1B, a circuit schematic diagram of JFET DRAM cell 100a according to an embodiment is set forth and given the general reference character 100b. JFET DRAM cell 100b includes a drain terminal 116, a source terminal 114, a gate terminal 112, a data storage region 108, and a deep n-well terminal 106. Data storage region 108 can operate as a back-gate terminal, for the JFET DRAM cell 100b.

The operation of JFET DRAM cell (100a and 100b) will now be explained.

As noted, data storage region 108 can be a p-type diffusion region. Data can be stored on data storage region 108 by collecting charge onto the data storage region 108. When electrons are collected on data storage region 108, a depletion region above data storage region 108 can encroach into channel region 110 so that when the gate terminal 112 is at zero volts (or slightly positive) with respect to a source terminal 114, JFET DRAM cell 100a and 100b (comprising a JFET) can be turned off. In this way, a high impedance path may be formed between the source terminal 114 and drain terminal 116. However, when holes are collected by data storage region 108, a depletion region above the data storage region 108 can be insufficient to turn off the JFET DRAM cell 100a and 100b (comprising a JFET). In this way, current can flow between the source 114 and drain 116 when the gate terminal 112 is at zero volts with respect to a source terminal 114. Thus, a low impedance path may be formed between the source terminal 114 and drain terminal 116.

JFET DRAM cell (100a and 100b) can have four primary modes of operation. A read operation in which data stored on data storage region 108 can be read out. An erase operation in which holes can be collected by the data storage region 108. A program operation in which holes can be depleted from the data storage region 108. A refresh operation in which charge can be restored onto the data storage region 108 after having leaked off.

In all of the following modes of operation, a deep n-well bias may be applied to deep N-well 106.

First, a cell erase mode of operation will be described.

An erase mode of operation can be used to allow the data storage region 108 to collect holes in a way similar to a bipolar junction transistor operation. A p-n junction forward bias voltage may be applied between the gate terminal 112 and the source and/or drain terminals (114 and 116) to allow a current to be flow from gate terminal 112 to the source and/or drain terminals (114 and 116). Because the channel region 110 is sufficiently thin, holes injected into the channel region 110 from the gate terminal 112 may be swept across the channel region 110 and collected by data storage region 108. In this way, data storage region 108 may reach a neutral state. In the erased state, the JFET DRAM cell (100a and 100b) may have a low impedance path between the drain terminal 116 and source terminal 114 with a zero volt bias (or a slightly positive voltage bias) between the gate terminal 112 and source terminal 114 (i.e. the JFET transistor may be turned on).

A cell program mode of operation will now be described.

The JFET DRAM cell (100a and 100b) may be programmed by utilizing a punch through condition between gate terminal 112 and the data storage region 108. To achieve the punch through condition, a negative gate bias may be applied to the gate terminal 112 while applying a drain/source bias to the drain and/or source terminals (114 and 116). Under this condition, the data storage region 108 may collect electrons and become negatively charged. A negatively charged data storage region 108 can induce a depletion region in the channel region 110 such that the JFET DRAM cell (100a and 100b) may have a high impedance path between the drain terminal 116 and source terminal 114 with a zero volt bias (or a slightly positive voltage bias) between the gate terminal 112 and source terminal 114 (i.e. the JFET transistor may be turned off).

A cell read mode of operation will now be described. In a read mode of operation, a gate bias may be applied to the gate terminal 112 while providing a drain voltage to the drain terminal 116 and a ground voltage to the source. If the JFET DRAM cell (100a and 100b) is in an erased state, a low impedance path may be formed between the drain terminal 116 and source terminal 114). The erased condition may correspond to a data zero, for example. If the JFET DRAM cell (100a and 100b) is in a programmed state, a high impedance path may be formed between the drain terminal 116 and source terminal 114). The programmed condition may correspond to a data one, for example.

A cell refresh mode of operation will now be described. A refresh operation may be conceptualized as a soft program mode of operation in that the JFET DRAM cells (100a and 100b) that are in the erased state should not be affected.

In a cell refresh mode of operation, the gate terminal 112 may be in a normal JFET DRAM cell deselect condition, for example zero volts, and a drain bias may be applied to the drain terminal 116. In this case, a relatively high reverse bias condition between the channel region 110 and data storage regions 108 that have been negatively charged (through previous programming or the like) may be created. Thus, only those JFET DRAM memory cells (100a and 100b) may have their negative charge replenished.

Figures 2, 3A:
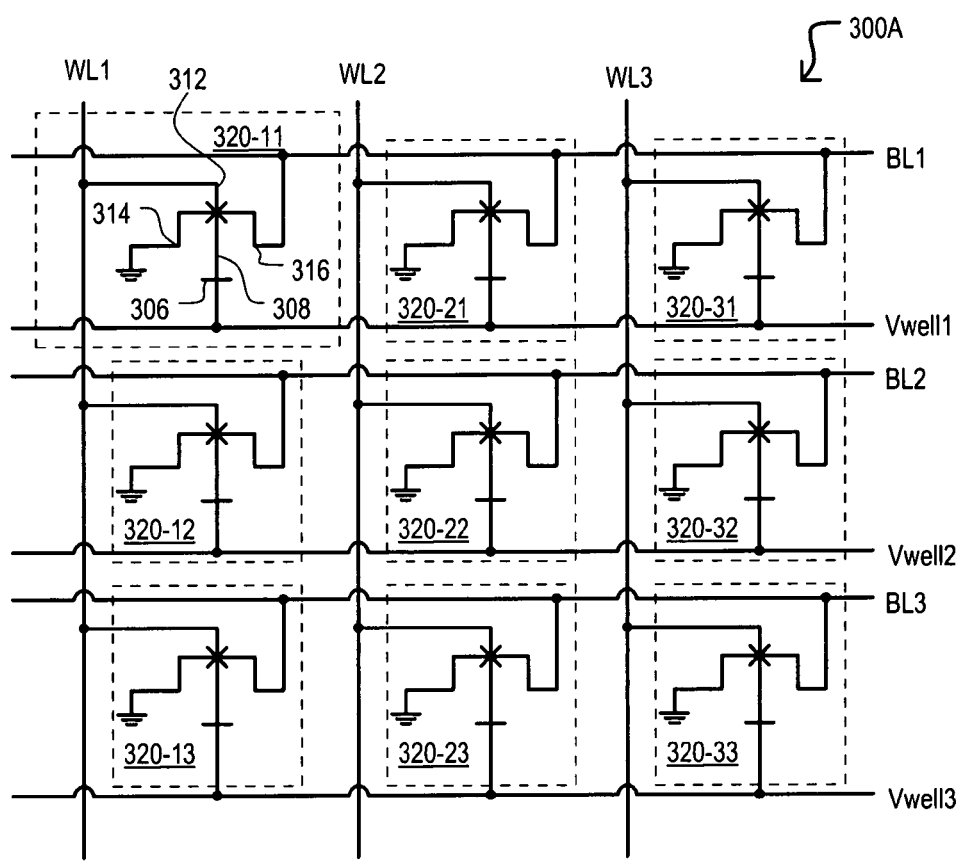
FIG. 2 is a table illustrating the voltage applied (Vg) to a gate terminal, the voltage applied (Vd) to a drain terminal, the voltage applied (Vs) to a source terminal, and the voltage applied (Vwell) to a deep N-well for various operation modes of a JFET DRAM cell according to an embodiment.
FIG. 3A is a circuit schematic diagram showing the configuration for an array of JFET DRAM cells according to an embodiment.

Referring now to FIG. 2, a table illustrating the voltage applied (Vg) to a gate terminal 112, the voltage applied (Vd) to a drain terminal 116, the voltage applied (Vs) to the source terminal 114, and the voltage applied (Vwell) to the deep N-well 106 for each of the four above-mentioned operation modes are set forth. In the erase mode of operation, the gate terminal 112 may have a gate voltage Vg=0.4 V, the drain terminal 116 may have a drain voltage Vd=−0.3 V, the source terminal 114 may have a source voltage Vs=0.0 V or −0.3 V, and the deep n-well terminal 106 may have a well voltage Vwell=0.5 V. In the program mode of operation, the gate terminal 112 may have a gate voltage Vg=−0.9 V, the drain terminal 116 may have a drain voltage Vd=0.5 V, the source terminal 114 may have a source voltage Vs=0.0 V or 0.5 V, and the deep n-well terminal 106 may have a well voltage Vwell=0.5 V. In the read mode of operation, the gate terminal 112 may have a gate voltage Vg=0.2 V, the drain terminal 116 may have a drain voltage Vd=0.1 V, the source terminal 114 may have a source voltage Vs=0.0 V, and the deep n-well terminal 106 may have a well voltage Vwell=0.5 V. In the refresh mode of operation, the gate terminal 112 may have a gate voltage Vg=0.0 V or a normal standby or read deselect bias, the drain terminal 116 may have a drain voltage Vd=0.5 V or the same as a normal program bias, the source terminal 114 may have a source voltage Vs=0.0 V or 0.5 V, and the deep n-well terminal 106 may have a well voltage Vwell=0.5 V.

Referring now to FIG. 3A, a circuit schematic diagram showing the configuration for an array of JFET DRAM cells according to an embodiment is set forth and given the general reference character 300A.

To avoid unduly cluttering the figure only 9 JFET DRAM cells are shown, although a DRAM may have 1 billion or more memory cells, for example.

Array 300A includes JFET DRAM cells (320-11 to 320-33) arranged in three rows and three columns. Three JFET DRAM cells (320-11 to 320-33) can be connected to each row (i.e. sharing a word line WL1 to WL3) and three JFET DRAM cells (320-11 to 320-33) can be connected to each column (i.e. sharing a bit line BL1 to BL3). Each JFET DRAM cell (320-11 to 320-33) can correspond to a JFET DRAM cell 100a and 100b. Each JFET DRAM cell (320-11 to 320-33) can include a deep n-well 306, a charge storage node 308, a source terminal 314, a drain terminal 316, and a gate terminal 312. In particular, JFET DRAM cells (320-11, 320-12, and 320-13) can have a gate terminal 312 connected to word line WL1. JFET DRAM cells (320-21, 320-22, and 320-23) can each have a gate terminal 312 connected to word line WL2. JFET DRAM cells (320-31, 320-32, and 320-33) can each have a gate terminal 312 connected to word line WL3. JFET DRAM cells (320-11, 320-21, and 320-31) can each have a drain terminal 316 connected to bit line BL1. JFET DRAM cells (320-12, 320-22, and 320-32) can each have a drain terminal 316 connected to bit line BL2. JFET DRAM cells (320-13, 320-23, and 320-33) can each have a drain terminal 316 connected to bit line BL3.

Figure 3B:
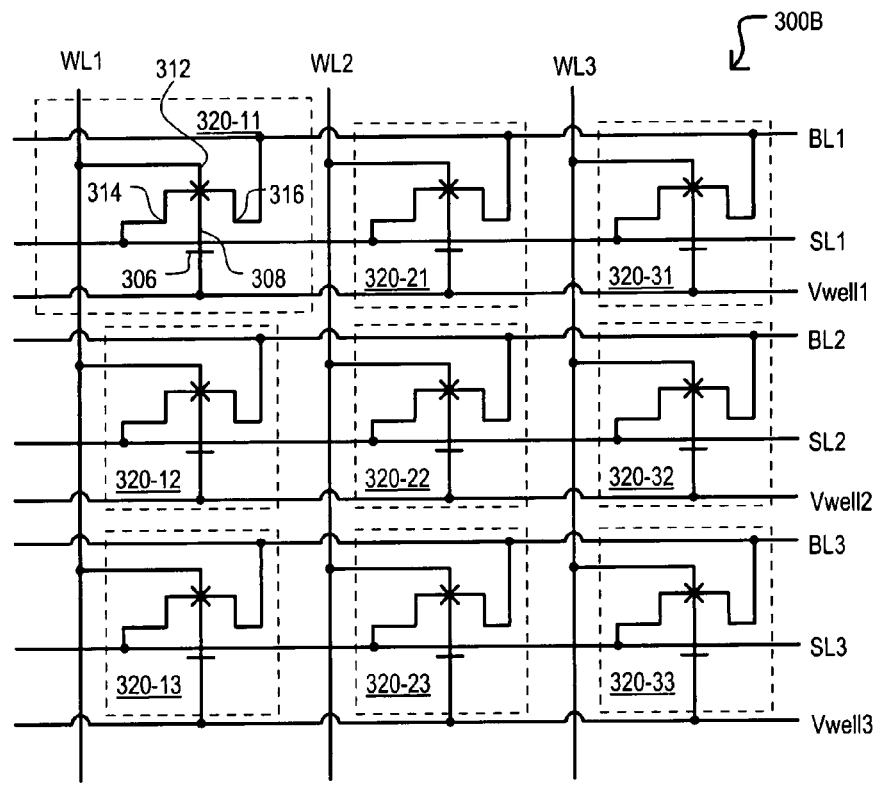
FIG. 3B is a circuit schematic diagram showing the configuration for an array of JFET DRAM cells according to an embodiment.
Figure 3C:
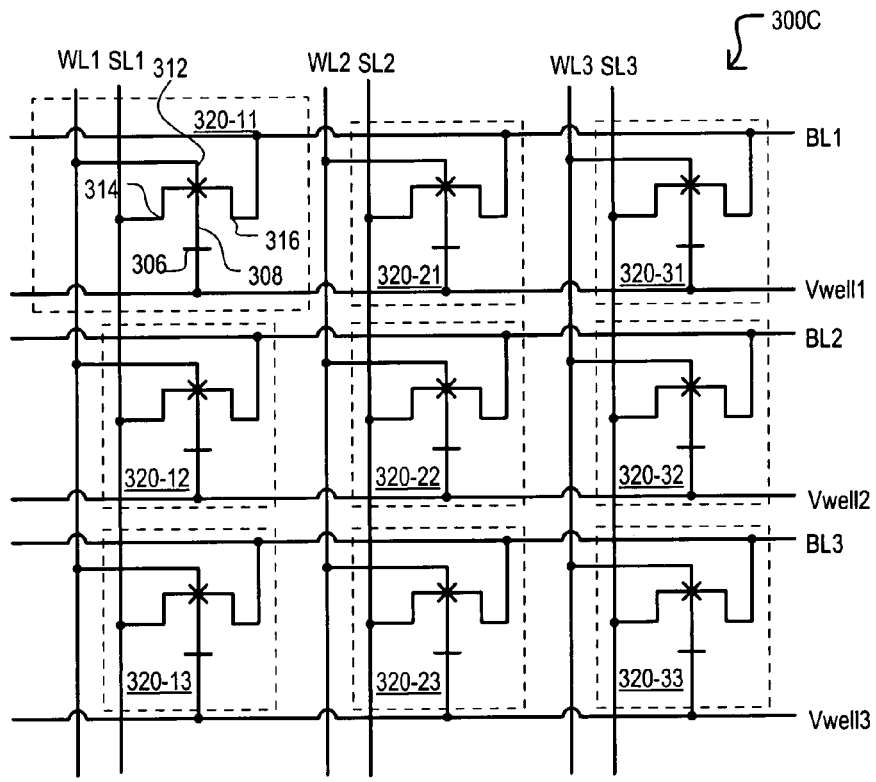
FIG. 3C is a circuit schematic diagram showing the configuration for an array of JFET DRAM cells according to an embodiment.

The embodiment of FIG. 3A illustrates the sources of JFET DRAM cells (320-11 to 320-33) are connected to ground. Referring now to FIG. 3B, a circuit schematic diagram showing the configuration for an array of JFET DRAM cells according to an embodiment is set forth and given the general reference character 300B. In the array 300B, the sources of JFET DRAM cells (320-11 to 320-33) can be connected to source lines (SL1 to SL3) running parallel to the bit lines (BL1 to BL3). Referring now to FIG. 3C, a circuit schematic diagram showing the configuration for an array of JFET DRAM cells according to an embodiment is set forth and given the general reference character 300C. In the array 300C, the sources of JFET DRAM cells (320-11 to 320-33) can be connected to source lines (SL1 to SL3) running parallel to the word lines (WL1 to WL3). The arrays 300B and 300C can allow greater flexibility for erase, program, or soft program operations by allowing the source and drain of a JFET DRAM cell (320-11 to 320-33) to be biased in the same manner.

Figure 4A:
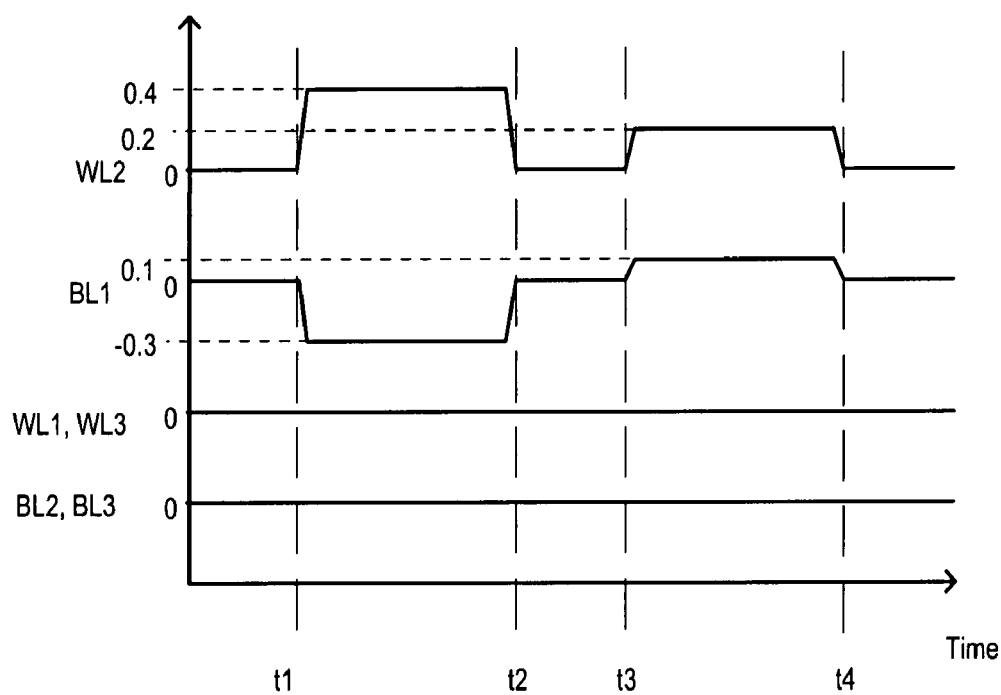
FIG. 4A is a timing diagram of an erase mode of operation according to an embodiment.

Referring now to FIG. 4A, a timing diagram of an erase mode of operation according to an embodiment is set forth. FIG. 4A illustrates an erase operation in which JFET DRAM cell 320-21 is erased (i.e. set to store data zero). Although not shown, the deep n-well bias (Vwell1 to Vwell3) can be commonly connected to a well bias voltage of 0.5 V.

At time t0, all word lines (WL1 to WL3) and bit lines (BL1 to BL3) may be at zero volts in a standby state. At time t1, word line WL2 may transition to about 0.4 Volts and bit line BL1 may transition to about a −0.3 volts. If the array uses the embodiments of FIG. 3B or 3C, the source line (SL1 in FIG. 3B or SL2 in FIG. 3C) may also transition to −0.3V to improve the erase efficiency. In this way, the pn junction formed by the gate terminal 312 to drain terminal 316 of JFET DRAM cell 320-21 may be forward biased and holes injected into the channel region from the gate terminal 312 may be swept across the channel region and collected by data storage region 308. In this way, data storage region 308 of JFET DRAM cell 320-21 may reach a neutral state.

Afterwards, a verify operation may be performed to ensure JFET DRAM cell 320-21 has been properly erased. At time t3, word line WL2 may transition to about 0.2 Volts and bit line BL1 may transition to about 0.1 Volts. It JFET DRAM cell 320-21 turns on and forms a relatively low impedance between the drain terminal 316 and source terminal 314, the erase operation was successful. However, if JFET DRAM cell 320-21 does not turn on and a relatively high impedance remains between the drain terminal 316 and source terminal 314, the erase operation was not successful. In this case, the erase operation may be repeated. At time t4, word line WL2 and bit line BL1 may return to a ground potential.

It should be noted, that a block erase may be performed by pulsing all of the word lines (WL1 to WL3) and bit lines (BL1 to BL3) in a similar way as word line WL2 and bit line BL1 as illustrated in FIG. 4(a). With an array (300B or 300C) as illustrated in FIGS. 3A and 3B, the source lines (SL1 to SL3) may be biased in the same way as bit lines (BL1 to BL3) to improve erase efficiency. In this way, a whole array or a whole block of JFET DRAM cells in an array may be erased.

Although the JFET DRAM cell 100a of the embodiment in FIG. 1A can have programmable threshold voltages that remain positive even in an erased state, alternative embodiments may include an erased state threshold voltage that is negative. In this case, word lines (WL1 to WL3) may be driven negative when a JFET DRAM cell 100a is deselected to properly turn off the current paths.

Figure 4B:
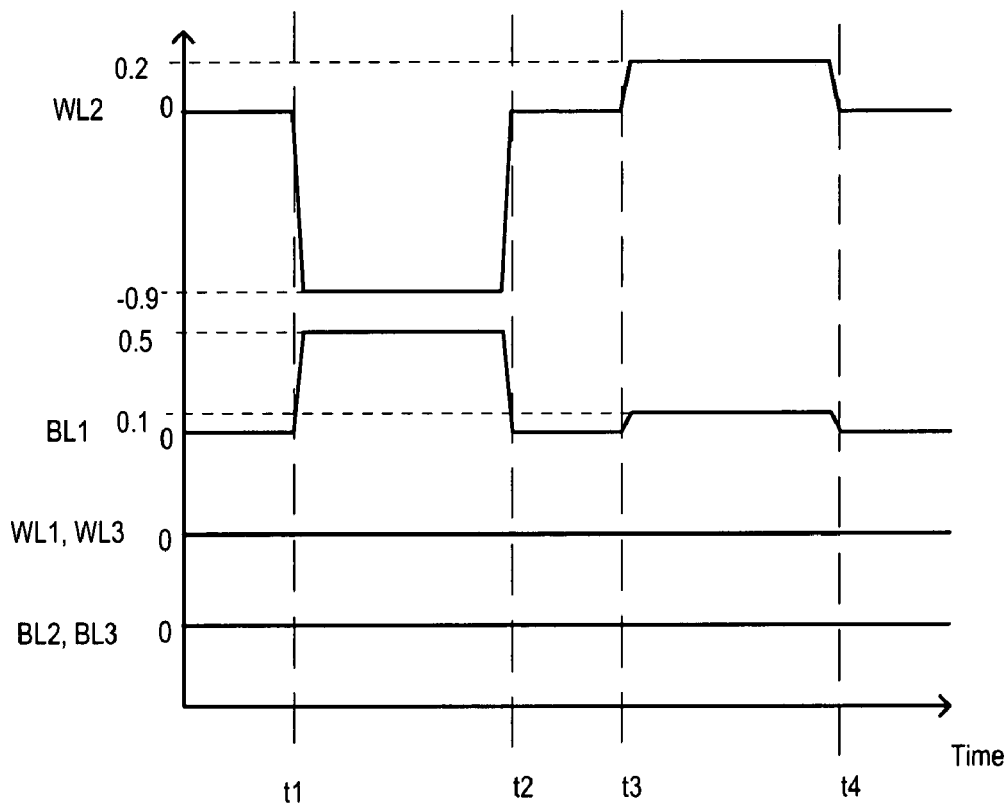
FIG. 4B is a timing diagram of a program operation according to an embodiment.

Referring to FIG. 4B, a timing diagram of a program operation according to an embodiment is set forth. FIG. 4B illustrates a program operation in which JFET DRAM cell 320-21 is programmed (i.e. set to store data one). Although not shown, the deep n-well bias (Vwell1 to Vwell3) can be commonly connected to a well bias voltage of 0.5 V.

At time t0, all word lines (WL1 to WL3) and bit lines (BL1 to BL3) may be at zero volts in a standby state. At time t1, word line WL2 may transition to about −0.9 Volts and bit line BL1 may transition to about a 0.5 volts. Respective source lines (SL1 to SL3) may transition in the same way as bit line BL1 to improve programming efficiency. In this way, the pn junction formed by the gate terminal 312 to drain terminal 316 and optionally source terminal 314 of JFET DRAM cell 320-21 may be reverse biased to induce a punch through condition. Under this condition, the data storage region 308 may have holes depleted near the channel junction and become negatively charged. A negatively charged data storage region 308 can induce a depletion region in the channel region such that the JFET DRAM cell 320-21 may have a high impedance path between the drain terminal 316 and source terminal 314 with a zero volt bias (or a slightly positive voltage bias) between the gate terminal 312 and source terminal 314 (i.e. the JFET transistor may be turned off). At time t2, the word lines (WL1 to WL3) and bit lines (BL1 to BL3) may return to ground.

Afterwards, a verify operation may be performed to ensure JFET DRAM cell 320-21 has been properly programmed. At time t3, word line WL2 may transition to about 0.2 Volts and bit line BL1 may transition to about 0.1 Volts. It JFET DRAM cell 320-21 remains off and forms a relatively high impedance between the drain terminal 316 and source terminal 314, the program operation was successful. However, if JFET DRAM cell 320-21 does turn on and a relatively low impedance remains between the drain terminal 316 and source terminal 314, the program operation was not successful. In this case, the program operation may be repeated. At time t4, word line WL2 and bit line BL1 may return to a ground potential.

It should be noted, that word may be written to in the JFET DRAM array 300 by first erasing a selected word along a word line (WL1 to WL3) and then programming selected bits along the word line (WL1 to WL3). In this way, data can be written to a complete word. For example, in a write of an 8-bit word, an erase operation may first be performed. A word line can go high to about 0.4 V while taking only the 8 bit lines that correspond to the 8-bit word to about −0.3 V. Optionally, the respective source lines (SL1 to SL3) may be driven to about −0.3 V to improve erase efficiency. In this way, the whole 8-bit word can be erased. Then a program operation can be performed only on the bits out of the 8-bit word that correspond to a data one.

Such an operation is illustrated by using the combined erase operation of FIG. 4A and the program operation of FIG. 4B. A word can consist of, for example, 8-bits, 16-bits, 32-bits, etc.

First an erase operation is performed to erase all bits of the word to set all the data bits to a data zero in parallel. Then a program operation is performed in which the bits of the word that have a data one value are programmed in parallel. For example, to write a data word "10101011", first a parallel erase operation on all 8-bits can be performed to give "00000000", then a program only the bits having a data one value can be performed to store the data word "10101011".

Alternatively, a write operation of a word can be performed by first programming all the all bits of the word to set all the data bits to a data one. Then an erase operation can be performed in which the bits of the word that have a data zero value are erased.

Also, a block program may be performed by pulsing all of the word lines (WL1 to WL3) and bit lines (BL1 to BL3) in a similar way as word line WL2 and bit line BL1 as illustrated in FIG. 4B. Optionally, the respective source lines (SL1 to SL3) may be driven the same as the bit lines (BL1 to BL3) improve program efficiency. In this way, a whole array or a whole block of JFET DRAM cells in an array may be programmed.

Figure 4C:
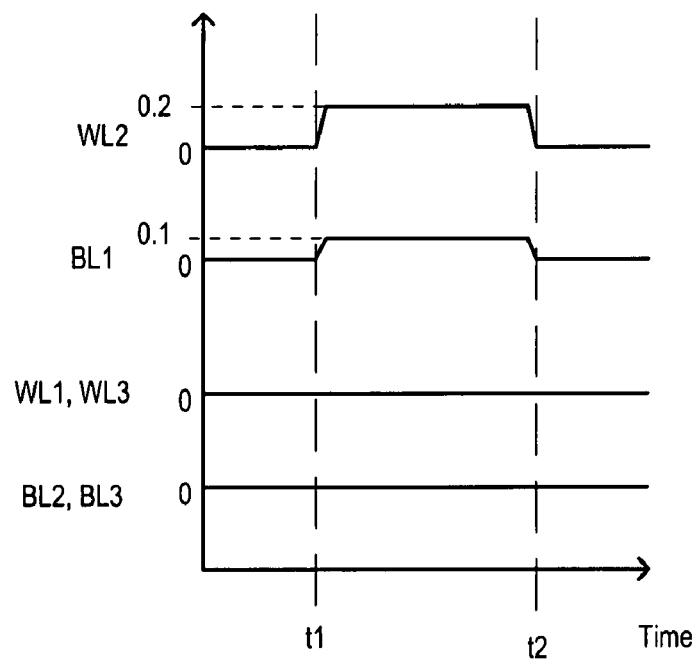
FIG. 4C is a timing diagram of a read operation according to an embodiment.

Referring now to FIG. 4C, a timing diagram of a read operation according to an embodiment is set forth. FIG. 4C illustrates a read operation in which JFET DRAM cell 320-21 is read (i.e. a data value stored in JFET DRAM cell 320-21 is detected. Although not shown, the deep n-well bias (Vwell1 to Vwell3) can be commonly connected to a well bias voltage of 0.5 V.

At time t0, all word lines (WL1 to WL3) and bit lines (BL1 to BL3) may be at zero volts or negatively biased in a standby state. At time t1, word line WL2 may transition to about 0.2 Volts and bit line BL1 may transition to about a 0.1 volts. In this way, a the impedance of JFET DRAM cell 320-21 may be determined in accordance with a data value stored in a data storage region 108. A high impedance value may indicate a data value of "one" and a low impedance value may indicate a data value of "zero". At time t2, the word line WL2 and bit line BL1 may return to the standby state.

Figure 4D:
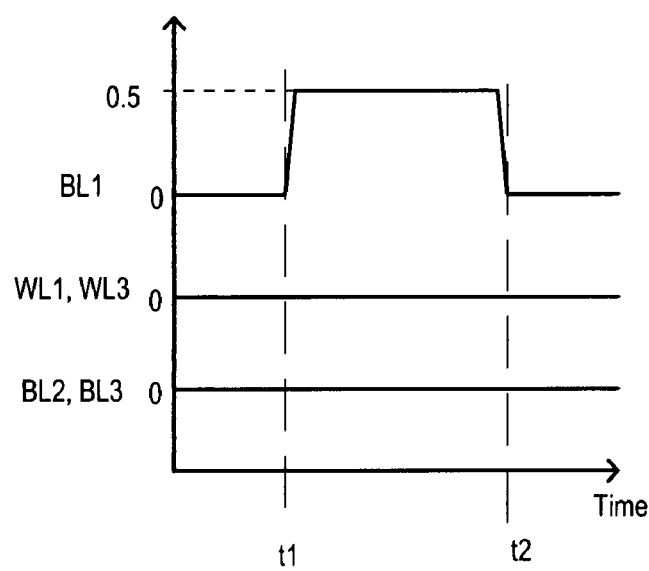
FIG. 4D is a timing diagram of a refresh operation according to an embodiment.

Referring now to FIG. 4D, a timing diagram of a refresh operation according to an embodiment is set forth.

A refresh operation can be performed as a operation at any time that the JFET DRAM array 300 is not being used. FIG. 4D shows a refresh operation in which only a single column is being refreshed. At time t0, all word lines (WL1 to WL3) and bit lines (BL1 to BL3) may be at zero volts (i.e. ground) or negatively biased in a standby state. At time t1, bit line BL1 may transition to about 0.5 Volts (i.e. the same voltage as in a program operation). In this way, a relatively high reverse bias condition between the channel regions and data storage regions 308 that have been negatively charged (through previous programming or the like) may be created. Thus, only those JFET DRAM memory cells (320-11 to 320-31) may have their negative charge replenished. At time t2, bit line BL1 may return to ground.

Note, block (or array) refresh can be performed by placing the refresh voltage (about 0.5V) on all the bit lines (BL1 to BL3) in an array simultaneously.

Referring now to FIG. 5A, a cross-section diagram of a JFET DRAM cell according to an embodiment is set forth and given the general reference character 500a. JFET DRAM cell 500a is a p-channel JFET DRAM cell. JFET DRAM cell 500a can be formed on a semiconductor substrate 502.

JFET DRAM cell 500a is formed between two isolation regions 504. Isolation regions 504 can be formed with a shallow trench isolation (STI) method or the like. JFET DRAM cell 500a can include a deep p-type well 506 formed on a semiconductor substrate 502. A data storing region 508 can be formed on the deep p-type well 506. The data storing region 508 can be formed by a n-well. A channel region 510 can be formed on the data storing region 508. The channel region 510 can be a p-type doped region. JFET DRAM cell 500a can include a source terminal 514, a gate terminal 512, and a drain terminal 516. The source terminal 514 and drain terminal 516 can be formed from a p-type polysilicon layer and the gate terminal 512 can be formed from a n-type polysilicon layer 512. The deep p-type well 506 can be electrically connected to a deep p-type well terminal (not shown) so that an electrical bias may be connected to the deep p-type well 506.

The polysilicon layer that forms gate terminal 512 can be used as a word line, for example. A bit line may be connected to the drain terminal 516. The bit line and word line can be orthogonal to each other. In this way, a bit line can connect a column of like JFET DRAM cells 500a and a word line can connect a row of like JFET DRAM cells 500a.

Referring now to FIG. 5B, a circuit schematic diagram of JFET DRAM cell 500a is set forth and given the general reference character 500b. JFET DRAM cell 500b includes a drain terminal 516, a source terminal 514, a gate terminal 512, a data storage region 508, and a deep p-well terminal 506. Data storage region 508 can operate as a back-gate terminal, for the JFET DRAM cell 500b.

Referring now to FIG. 6, a table illustrating the voltages applied to the terminals of JFET DRAM cell 500a and 500b for various operations according to an embodiment is set forth.

The table of FIG. 6, illustrates the voltage applied (Vg) to a gate terminal 512, the voltage applied (Vd) to a drain terminal 516, the voltage applied (Vs) to the source terminal 514, and the voltage applied (Vwell) to the deep p-well 506 for each of the four above-mentioned operation modes are set forth. In the erase mode of operation, the gate terminal 512 may have a gate voltage Vg=-0.1 V, the drain terminal 516 may have a drain voltage Vd=0.8 V, the source terminal 514 may have a source voltage Vs=0.5 V (optionally source voltage Vs=0.8 V to improve erase efficiency), and the deep p-well terminal 506 may have a well voltage Vwell=0.0 V. In the program mode of operation, the gate terminal 512 may have a gate voltage Vg=1.4 V, the drain terminal 516 may have a drain voltage Vd=0.0 V, the source terminal 514 may have a source voltage Vs=0.5 V (optionally source voltage Vs=0.0 V to improve program efficiency), and the deep p-well terminal 506 may have a well voltage Vwell=0.0 V. In the read mode of operation, the gate terminal 512 may have a gate voltage Vg=0.3 V, the drain terminal 516 may have a drain voltage Vd=0.4 V, the source terminal 514 may have a source voltage Vs=0.5 V, and the deep p-well terminal 506 may have a well voltage Vwell=0.0 V. In the refresh mode of operation, the gate terminal 512 may have a gate voltage Vg=0.5 V, the drain terminal 516 may have a drain voltage Vd=0.0 V, the source terminal 514 may have a source voltage Vs=0.5 V or 0.0 V, and the deep p-well terminal 506 may have a well voltage Vwell=0.0 V.

A JFET DRAM cell such as illustrated in FIGS. 1A, 1B, 5A, and 5B may be used with an access transistor to form a two transistor JFET DRAM cell (TTJFET DRAM cell). One such example of a JFET DRAM cell such as illustrated in FIGS. 1A and 1B in a TTJFET DRAM cell is shown in FIGS. 7A and 7B.

In FIG. 7A, a cross-sectional diagram of a TTJFET DRAM cell utilizing a JFET DRAM cell according to an embodiment is set forth and given the general reference character 700a. In FIG. 7B, a circuit schematic diagram of a TTJFET DRAM cell utilizing a JFET DRAM cell according to an embodiment is set forth and given the general reference character 700b.

Referring now to FIGS. 7A and 7B, the TTJFET DRAM cell (700a and 700b) utilizing a JFET DRAM cell can include a JFET DRAM cell 750 and a JFET access transistor 760.

The JFET DRAM cell 750 is formed between two isolation regions 704. Isolation regions 704 can be formed with a shallow trench isolation (STI) method or the like. JFET DRAM cell 750 can include a deep n-type well 706 formed on a semiconductor substrate 702. A data storing region 708 can be formed on the deep n-type well 706. The data storing region 708 can be formed by a p-well. A channel region 710 can be formed on the data storing region 708. The channel region 710 can be a n-type doped region. JFET DRAM cell 750 can include a source terminal 714, a gate terminal 712, and a drain terminal 716. The source terminal 714 and drain terminal 716 can be formed from a n-type polysilicon layer and the gate terminal 712 can be formed from a p-type polysilicon layer 712. The deep n-type well 706 can be electrically connected to a deep n-type well terminal (not shown) so that an electrical bias may be connected to the deep n-type well 706.

The JFET access transistor 760 is formed between two isolation regions 704. Isolation regions 704 can be formed with a shallow trench isolation (STI) method or the like. JFET access transistor 760 can include a deep n-type well 726 formed on a semiconductor substrate 702. The back gate region 728 can be formed by a p-well. A channel region 730 can be formed on the back gate region 728. The channel region 730 can be a n-type doped region. JFET access transistor 760 can include a source terminal 734, a gate terminal 732, and a drain terminal 736. The source terminal 734 and drain terminal 736 can be formed from a n-type polysilicon layer and the gate terminal 732 can be formed from a p-type polysilicon layer. The deep n-type well 706 can be electrically connected to a deep n-type well terminal (not shown) so that an electrical bias may be connected to the deep n-type well 706.

Back gate region 728 can be electrically connected to gate terminal 732. In this way, JFET access transistor 760 can be a double-gate JFET transistor and better control may be provided to channel region 730.

Referring now to FIG. 7C, a cross-sectional diagram of TTJFET DRAM cell 700a along the gate electrode 732 according to an embodiment is set forth. Before the p-doped polysilicon comprising gate electrode 732 was deposited, the STI area 704 has been etched at least down to the back gate region 728. In this way, the front gate 732 can be electrically connected to the back gate region 728. It should be noted that as long as the etch reaches the back gate region 728 and does not reach the p-type substrate 702, any over-etching or slight under-etching may not be detrimental to the performance of the JFET access transistor 760.

TTJFET DRAM cell (700a and 700b) can have an advantage by reducing leakage current as compared to JFET DRAM cell (100a and 100b). Furthermore, by providing JFET access transistor 760, programming and erasing operations may have more margins as there is no need to worry about inadvertently conducting current through the JFET DRAM cell 750.

The polysilicon layer that forms gate terminal 732 of JFET access transistor 760 can be used as a word line (WL), for example. Source terminal 734 can be connected to a source voltage on a source line SL. The gate terminal 712 of JFET DRAM cell 750 can be connected to a bias voltage Vb. The drain terminal 716 of JFET DRAM cell 750 can be connected to a bit line BL. The bit line and word line can be orthogonal to each other. In this way, a bit line can connect a column of like TTJFET DRAM cells 700a and a word line (WL) can connect a row of like TTJFET DRAM cells 700a.

It should be noted that the JFET DRAM cell 750 and JFET access transistor 760 can be switched such that the JFET access transistor 760 may be on the top of the stack and connected to the bit line BL while the JFET DRAM cell 750 may be on the bottom of the stack and connected to the source line SL.

The operation of TTJFET DRAM cell (700a and 700b) will now be described by referring to FIGS. 7A, 7B, and 8. FIG. 8 is a table indicating the voltages applied to TTJFET DRAM cell (700a and 700b) during various modes of operation according to an embodiment.

The JFET DRAM cell 750 can be programmed and erased using the same mechanisms as JFET DRAM cell 100a and 100b as described previously.

The table of FIG. 8 shows voltages applied to the word line WL, bit line BL, bias voltage Vb, and source voltage Vvss for an erase mode, program mode, read mode, and refresh mode of operation.

In particular, in an erase mode of operation the word line WL may be set to either about 0.0 volts when the TTJFET DRAM cell (700a and 700b) is to be erased or to −0.3 volts when the TTJFET DRAM cell (700a and 700b) is not to be erased. The bit line BL may be set to about 0.0 volts or −0.3 volts to improve erase efficiency, the bias voltage Vb may be set to about 0.4 volts, and the source voltage Vvss may be set to about −0.3 volts. An erased TTJFET DRAM cell (700a and 700b) may be considered a data zero and may provide a JFET DRAM cell 750 having a threshold voltage Vth of about −0.4 volts.

In a program mode of operation the source line voltage Vvss may be set to either about 0.5 volts when the TTJFET DRAM cell (700a and 700b) is to be programmed or to 0.0 volts when the TTJFET DRAM cell (700a and 700b) is not to be programmed. The word line WL may be set to about 0.7 volts, the bias voltage Vb may be set to about −1.0 volts, and the bit line BL may be set to about 0.5 volts or 0.0 volts. A programmed TTJFET DRAM cell (700a and 700b) may be considered a data one and may provide a JFET DRAM cell 750 having a threshold voltage Vth of about 0.4 volts.

In a read mode of operation, bias voltage Vb may be about 0.2 volts and the word line WL may be 0.5 volts for a TTJFET DRAM cell (700a and 700b) being read and may be 0.0 volts for a TTJFET DRAM cell (700a and 700b) that is not being read. Bit line BL and source line SL may be sense nodes. Alternatively a source voltage Vvss may be applied to source line SL and only bit line BL may be used in a single ended sensing scheme.

Figure 9:
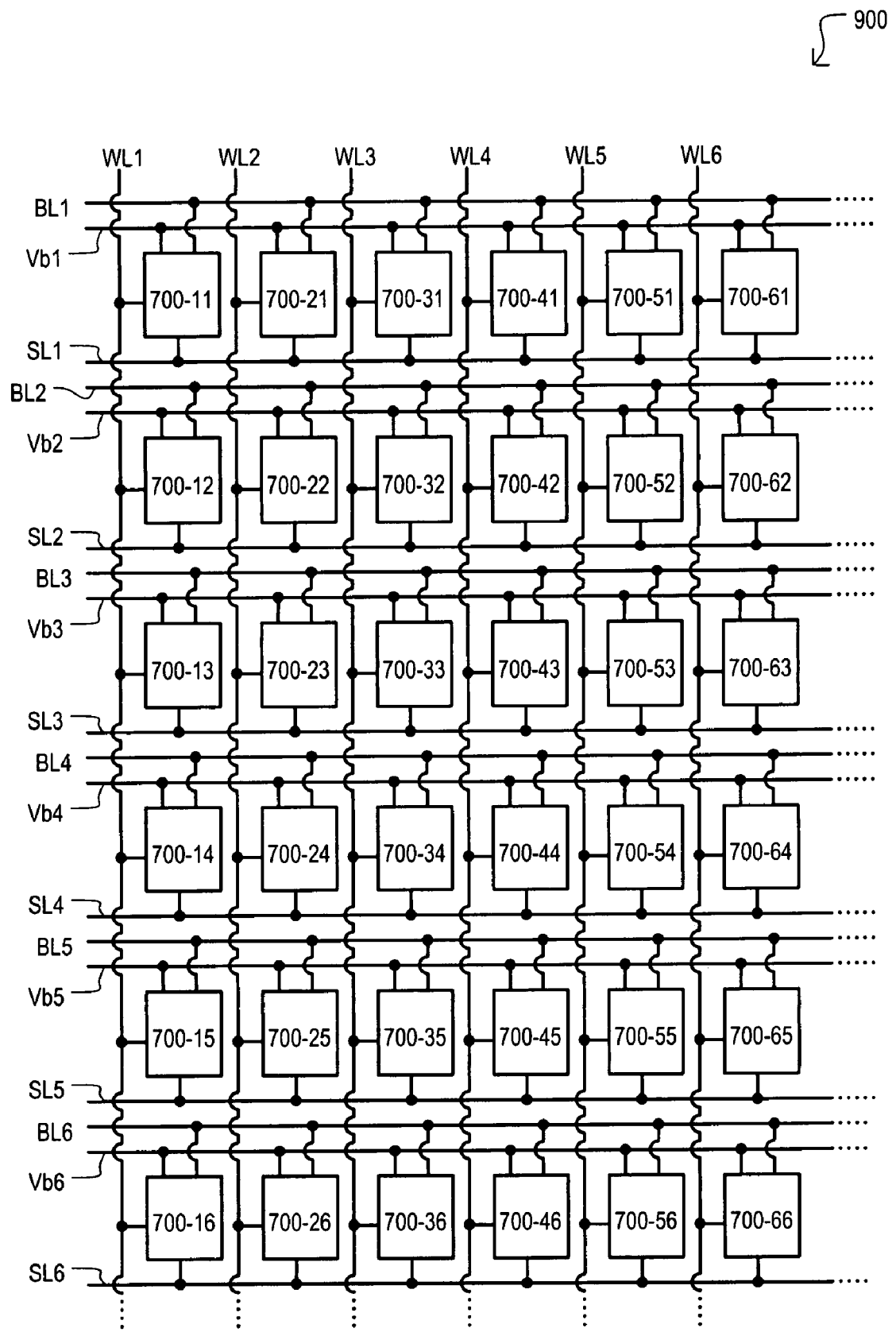
FIG. 9 is a circuit schematic diagram of an array of TTDRAM cells according to an embodiment.

Referring now to FIG. 9, a circuit schematic diagram of an array of TTDRAM cells according to an embodiment is set forth and given the general reference character 900. Array of TTJFET DRAM cells 900 only shows 36 TTJFET DRAM cells (700-11 to 700-66) to avoid unduly cluttering the figure although a DRAM may have 1 billion or more memory cells, for example. Each TTJFET DRAM cell (700-11 to 700-66) can be configured like TTJFET DRAM cell 700b.

Array of TTJFET DRAM cells 900 includes TTJFET DRAM cells (700-11 to 700-66) arranged in six rows and six columns. Six TTJFET DRAM cells (700-11 to 700-66) can be connected to each row (i.e. sharing a word line WL1 to WL6) and six TTJFET DRAM cells (700-11 to 700-66) can be connected to each column (i.e. sharing a bit line BL1 to BL6). Additionally, each of the six columns TTJFET DRAM cells (700-11 to 700-61, 700-12 to 700-62, 700-13 to 700-63, 700-14 to 700-64, 700-15 to 700-65, 700-16 to 700-66) can share a reference voltage line (Vb1 to Vb6) and source line (SL1 to SL6).

Referring now to FIG. 7B in conjunction with FIG. 9, each TTJFET DRAM cell (700-11 to 700-66) can correspond to a TTJFET DRAM cell 700b. Each TTJFET DRAM cell (700-11 to 700-66) can include a JFET DRAM cell 750 and a JFET access transistor 760.

The gate electrode 732 and back gate region 728 of each JFET access transistor 760 in row of TTJFET DRAM cells (700-11 to 700-16) can be connected to word line WL1. The gate electrode 732 and back gate region 728 of each JFET access transistor 760 in row of TTJFET DRAM cells (700-21 to 700-26) can be connected to word line WL2. The gate electrode 732 and back gate region 728 of each JFET access transistor 760 in row of TTJFET DRAM cells (700-31 to 700-36) can be connected to word line WL3. The gate electrode 732 and back gate region 728 of each JFET access transistor 760 in row of TTJFET DRAM cells (700-41 to 700-46) can be connected to word line WL4. The gate electrode 732 and back gate region 728 of each JFET access transistor 760 in row of TTJFET DRAM cells (700-51 to 700-56) can be connected to word line WL5. The gate electrode 732 and back gate region 728 of each JFET access transistor 760 in row of TTJFET DRAM cells (700-61 to 700-66) can be connected to word line WL6.

The column of TTJFET DRAM cells (700-11 to 700-61) can have a drain electrode 716 and gate electrode 712 of each JFET DRAM cell 750 and a source electrode 734 of each JFET access transistor 760 connected to bit line BL1, reference voltage line Vb1, and source line SL1, respectively. The column of TTJFET DRAM cells (700-12 to 700-62) can have a drain electrode 716 and gate electrode 712 of each JFET DRAM cell 750 and a source electrode 734 of each JFET access transistor 760 connected to bit line BL2, reference voltage line Vb2, and source line SL2, respectively. The column of TTJFET DRAM cells (700-13 to 700-63) can have a drain electrode 716 and gate electrode 712 of each JFET DRAM cell 750 and a source electrode 734 of each JFET access transistor 760 connected to bit line BL3, reference voltage line Vb3, and source line SL3, respectively. The column of TTJFET DRAM cells (700-14 to 700-64) can have a drain electrode 716 and gate electrode 712 of each JFET DRAM cell 750 and a source electrode 734 of each JFET access transistor 760 connected to bit line BL4, reference voltage line Vb4, and source line SL4, respectively. The column of TTJFET DRAM cells (700-15 to 700-65) can have a drain electrode 716 and gate electrode 712 of each JFET DRAM cell 750 and a source electrode 734 of each JFET access transistor 760 connected to bit line BL5, reference voltage line Vb5, and source line SL5, respectively. The column of TTJFET DRAM cells (700-16 to 700-66) can have a drain electrode 716 and gate electrode 712 of each JFET DRAM cell 750 and a source electrode 734 of each JFET access transistor 760 connected to bit line BL6, reference voltage line Vb6, and source line SL6, respectively.

The operation modes of a DRAM device including the array of TTJFET DRAM cells 900 will now be described by referring to FIGS. 7A, 7B, 7C, 8, 9, 10A, 10B, 10C, 10D, 10E, 10F, and 10G.

First an erase mode of operation will be explained.

Figure 10A:
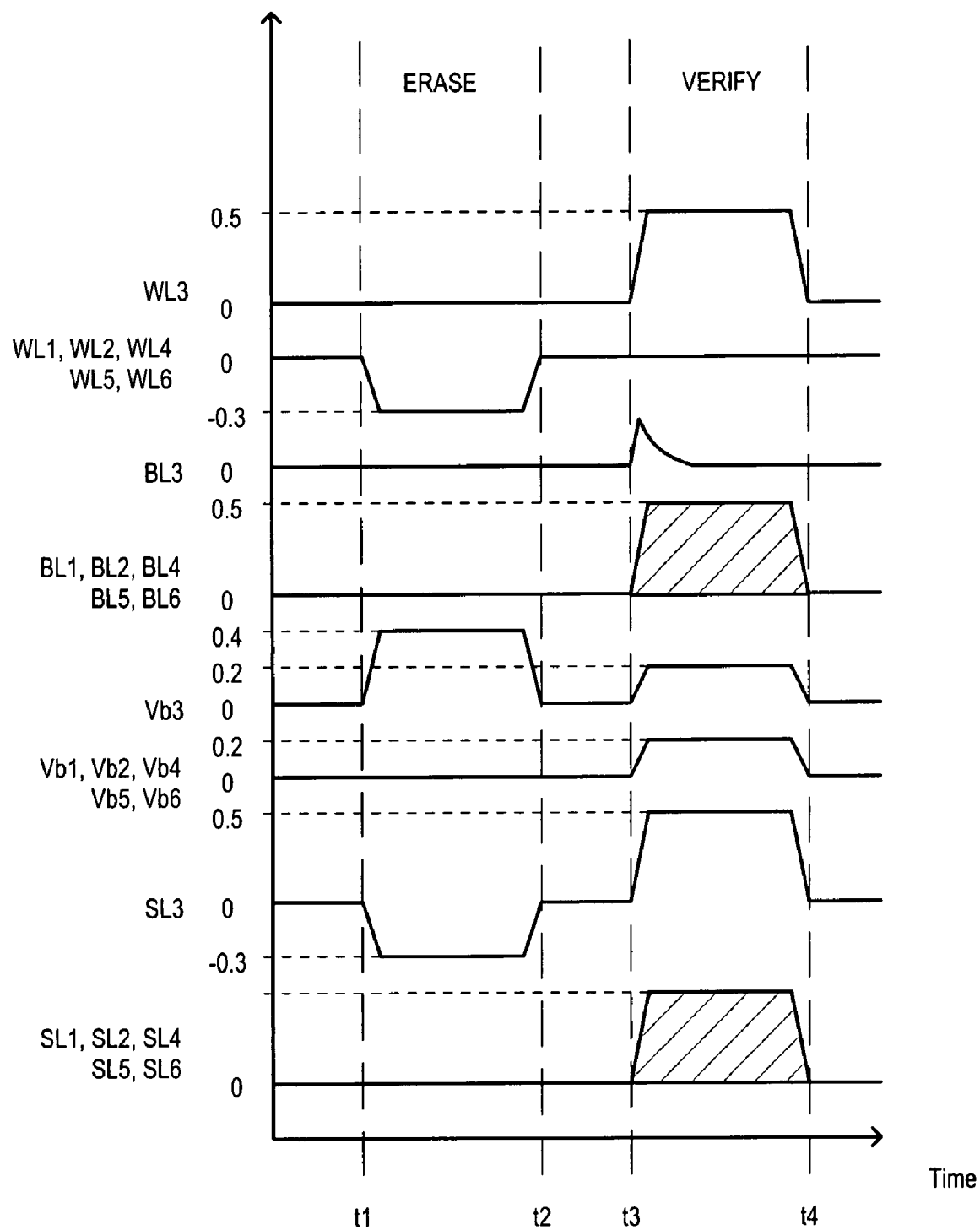
FIG. 10A is a timing diagram of an erase mode of operation according to an embodiment.

FIG. 10A is a timing diagram of an erase mode of operation according to an embodiment. FIG. 10A illustrates an erase operation in which TTJFET DRAM cell 700-33 is erased (i.e. set to store data zero). Although not shown, the deep n-well bias 706 and 726 for each TTJFET DRAM cell (700-11 to 700-66) can be commonly connected to a well bias voltage of 0.5 V.

At time t0, all word line (WL1 to WL6), bit lines (BL1 to BL6), bias voltage lines (Vb1 to VB6), and source lines (SL1 to SL6) may be at zero volts in a standby state.

At time t1, word lines (WL1, WL2, WL4, WL5, and WL6) may transition to about −0.3 volts, bias line Vb3 may transition to about 0.4 volts, and source line SL3 may transition to about a −0.3 volts while word line WL3 may maintain a ground potential (i.e. 0.0 volts). When source line SL3 transitions to −0.3 volts, JFET access transistor 760 of TTJFET DRAM cell 700-33, can turn on and the −0.3 volts may be passed to a source terminal 714 of JFET DRAM cell 750 of TTJFET DRAM cell 700-33. In this way, the pn junction formed by the gate terminal 712 to source terminal 714 of TTJFET DRAM cell 700-33 may be forward biased and holes injected into the channel region from the gate terminal 712 may be swept across the channel region and collected by data storage region 708. By doing so, data storage region 708 of TTJFET DRAM cell 700-33 may be erased and may achieve a threshold voltage Vth of about −0.4 volts. However, because the word lines (WL1, WL2, WL4, WL5, and WL6) have transitioned to about −0.3 volts, JFET access transistors 760 in TTJFET memory cells (700-13, 700-23, 700-43, 700-53, and 700-63) that share source line SL3 may remain off even though source line SL3 is at about −0.3 volts. It should be noted, in the erase mode for a single TTJFET DRAM cell, the corresponding bit line (in this example bit line BL3) may also be biased at −0.3 volts at time t1, thus improving erase efficiency.

At time t2, all word line (WL1 to WL6), bit lines (BL1 to BL6), bias voltage lines (Vb1 to Vb6), and source lines (SL1 to SL6) may return to zero volts (i.e. a standby state).

Afterwards, a verify operation may be performed to ensure TTJFET DRAM cell 700-33 has been properly erased. At time t3, word line WL3 may transition to about 0.5 volts and bias line Vb3 may transition to about 0.2 volts. If JFET DRAM cell 750 of TTJFET DRAM cell 700-33 turns on and forms a relatively low impedance between the drain terminal 716 and source terminal 714, the erase operation was successful. This can be detected by sensing the impedance between bit line BL3 and source line SL3. However, if JFET DRAM cell 750 of TTJFET DRAM cell 700-33 does not turn on and a relatively high impedance remains between the drain terminal 316 and source terminal 314, the erase operation was not successful. In this case, the erase operation may be repeated. At time t4, word line WL3 and bit line BL3 may return to a ground potential.

Although, an example has been shown for erasing a single TTJFET DRAM cell (700-11 to 700-66), TTJFET DRAM cells (700-11 to 700-66) may be erased in a row erase, a column erase, a partial row, a partial column erase, or a block erase.

Figure 10B:
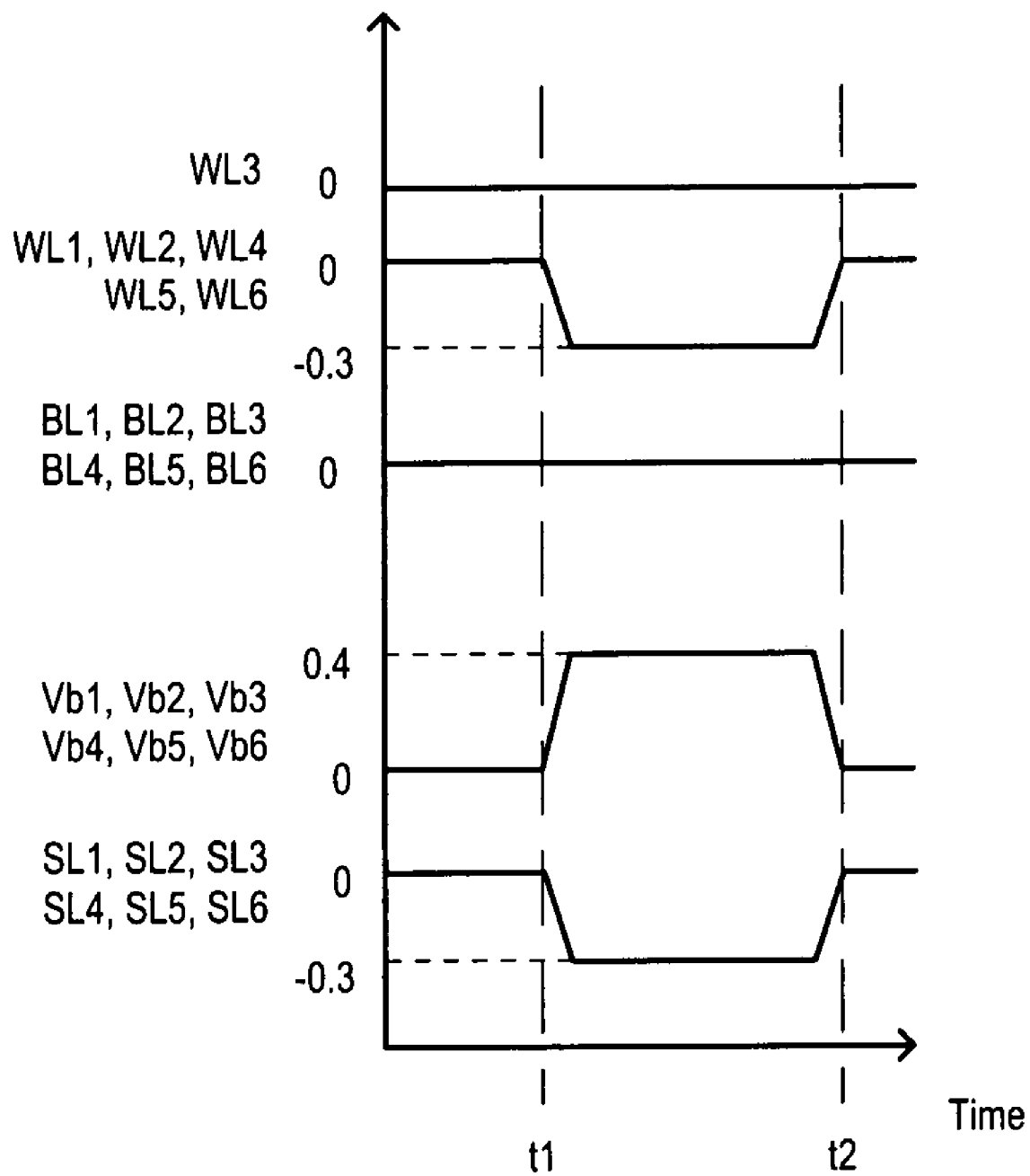
FIG. 10B is a timing diagram of a row erase mode of operation according to an embodiment.

A timing diagram illustrating a row erase operation in array of TTJFET DRAM cell 900 is set forth in FIG. 10B. FIG. 10B illustrates erasing all the TTJFET DRAM cells (700-31 to 700-36) connected to word line WL3.

The timing diagram of FIG. 10B may differ from the timing diagram of FIG. 10A in that all source lines (SL1 to SL6) may be set to −0.3 volts between times t1 and t2. Also, all bias voltage lines (Vb1 to Vb6) may be set to about 0.4 volts between times t1 and t2. In this way, the pn junction formed by the gate terminal 712 to source terminal 714 of TTJFET DRAM cells (700-31 to 700-36) may be forward biased and holes injected into the channel region from the respective gate terminals 712 may be swept across the channel region and collected by the respective data storage regions 708. By doing so, data storage regions 708 of row of TTJFET DRAM cells (700-31 to 700-36) connected to word line WL3 may be erased and may achieve a threshold voltage Vth of about −0.4 volts. Optionally, the bit lines (BL1 to BL6) may be biased at about −0.3 volts at time t1, thus improving erase efficiency.

In order to perform a partial row erase in the row connected to word line WL3, only the bias lines (Vb1 to Vb6) and source lines (SL1 to SL6) connected to the TTJFET DRAM cells (700-31 to 700-36) which are desired to be erased may be set to 0.4 volts and −0.3 volts, respectively between times t1 and t2.

Figure 10C:
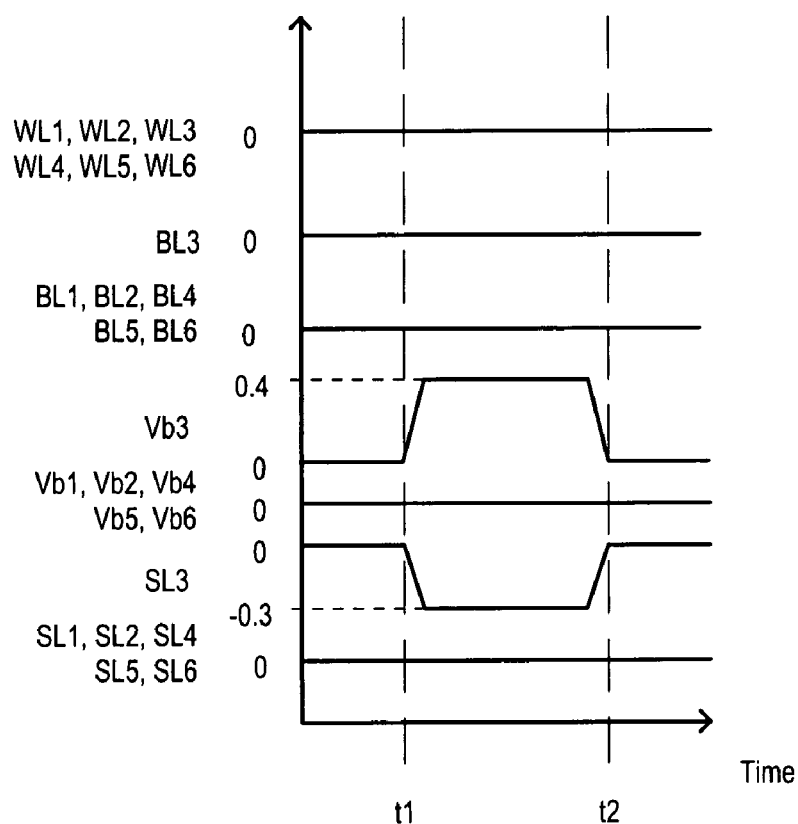
FIG. 10C is a timing diagram of a column erase mode of operation according to an embodiment.

A timing diagram illustrating a column erase operation in array of TTJFET DRAM cell 900 is set forth in FIG. 10C. FIG. 10C illustrates erasing all the TTJFET DRAM cells (700-13 to 700-63) connected to bit line BL3.

The timing diagram of FIG. 10C may differ from the timing diagram of FIG. 10A in that all word lines (WL1 to WL6) may be set to 0.0 volts between times t1 and t2. In this way, the pn junction formed by the gate terminal 712 to drain terminal 716 of TTJFET DRAM cells (700-13 to 700-63) connected to bit line BL3 may be forward biased and holes injected into the channel region from the respective gate terminals 712 may be swept across the channel region and collected by the respective data storage regions 708. By doing so, data storage regions 708 of row of TTJFET DRAM cells (700-13 to 700-63) connected to bit line BL3 may be erased and may achieve a threshold voltage Vth of about −0.4 volts.

In order to perform a partial column erase in the column connected to bit line BL3, only the word lines (WL1 to WL6) connected to the TTJFET DRAM cells (700-13 to 700-63) which are desired to be erased may be set to 0.0 volts. The word lines (WL1 to WL6) connected to the TTJFET DRAM cells (700-13 to 700-63) which are not to be erased may be set to −0.3 volts between times t1 and t2.

Figure 10D:
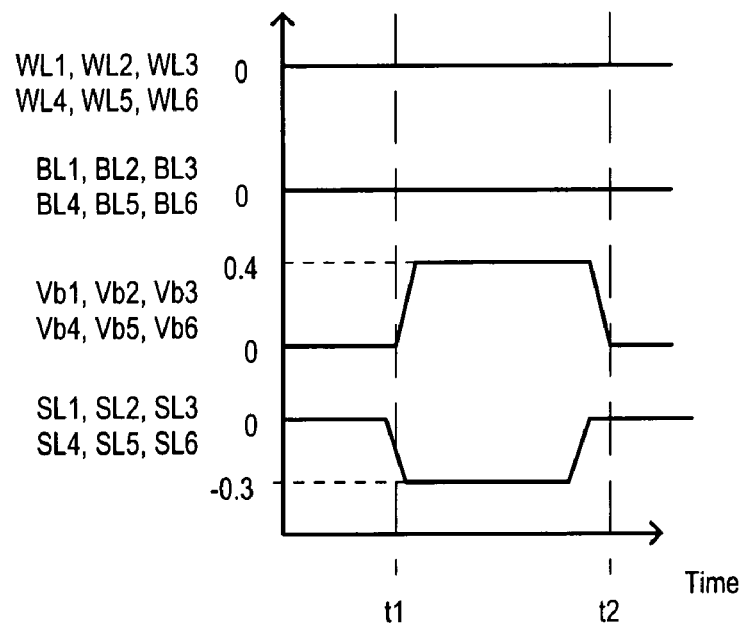
FIG. 10D is a timing diagram of full block erase mode of operation according to an embodiment.

A timing diagram illustrating a full block erase operation in array of TTJFET DRAM cells 900 is set forth in FIG. 10D. FIG. 10D illustrates erasing all the TTJFET DRAM cells (700-11 to 700-66) in the array of TTJFET DRAM cells 900.

The timing diagram of FIG. 10D may differ from the timing diagram of FIG. 10A in that all word lines (WL1 to WL6) may be set to 0.0 volts between times t1 and t2, all bit lines (BL1 to BL6) may be set to 0.0 volts or to −0.3 volts to improve erase efficiency between t1 and t2, all bias lines (Vb1 to Vb3) may be set to 0.4 volts between t1 and t2, and all source lines (SL1 to SL3) may be set to −0.3 volts between t1 and t2. In this way, the pn junction formed by the gate terminal 712 to drain terminal 716 of TTJFET DRAM cells (700-11 to 700-66) may be forward biased and holes injected into the channel region from the respective gate terminals 712 may be swept across the channel region and collected by the respective data storage regions 708. By doing so, data storage regions 708 of TTJFET DRAM cells (700-11 to 700-66) may be erased and may achieve a threshold voltage Vth of about −0.4 volts.

A partial block erase can be an operation in which a sub-block smaller than the array of TTJFET DRAM cells 900 is erased.

Figure 10E:
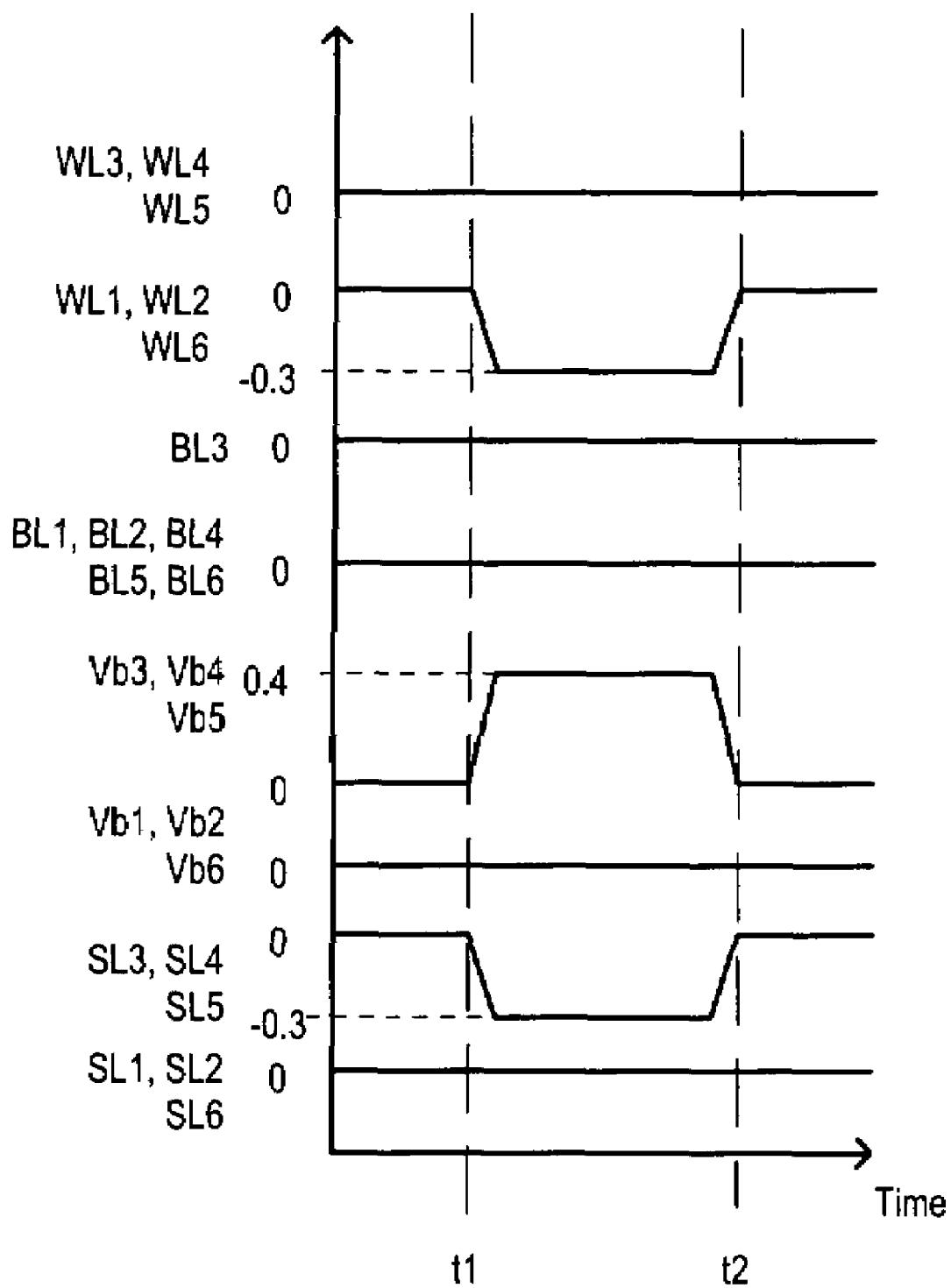
FIG. 10E is a timing diagram of a partial block erase mode of operation according to an embodiment.

A timing diagram illustrating a partial block erase operation in array of TTJFET DRAM cells 900 is set forth in FIG. 10E. FIG. 10E illustrates erasing a partial block the TTJFET DRAM cells (700-11 to 700-66) in the array of TTJFET DRAM cells 900. The partial block can be the TTJFET DRAM cells (700-11 to 700-66) commonly connected to word lines (WL3 to WL5) and bit lines (BL3 to BL5), for example.

In order to perform the partial block erase, only the word lines (WL3 to WL5), bias lines (Vb3 to Vb5), and source lines (SL3 to SL5) connected to the TTJFET DRAM cells (700-23 to 700-45) which are desired to be erased may be set to 0.0 volts, 0.4 volts, and −0.3 volts respectively. All other word lines (WL1, WL2, and WL6), bias lines (Vb1, Vb2, and Vb6), and source lines (SL1, SL2, and SL6) may be set to –0.3 volts, 0.0 volts, and 0.0 volts, respectively, between times t1 and t2.

A program mode of operation will now be discussed.

In a program operation, the first step is to program a whole word or all TTJFET DRAM cells connected to the bit line (i.e. column) in which the TTJFET DRAM cell that is desired to be programmed is included. Afterwards, a partial column erase operation as set forth above is performed to return all the TTJFET DRAM cells that are to retain the erased state to a data zero.

Figure 10F:
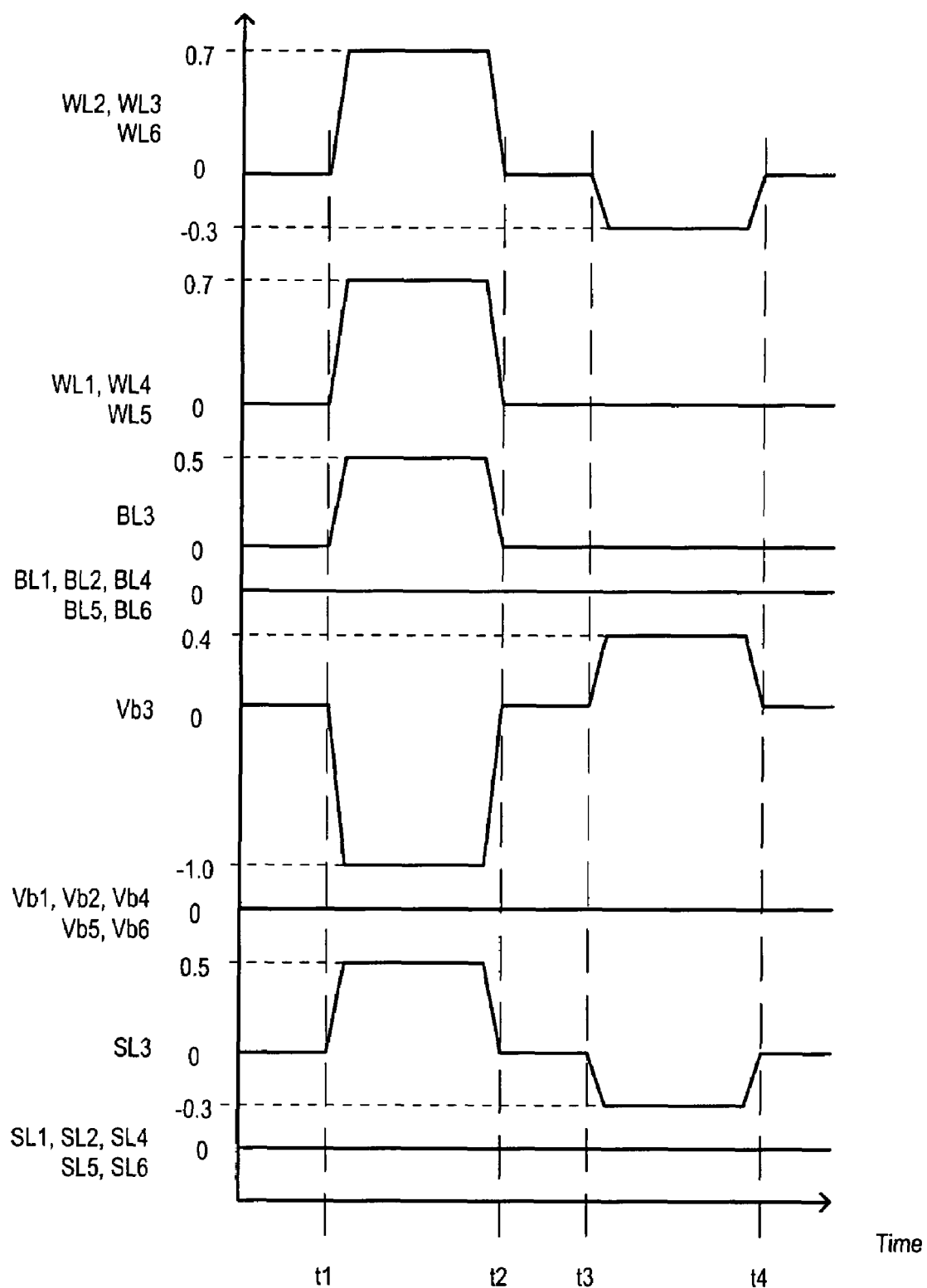
FIG. 10F is a timing diagram of a program mode of operation according to an embodiment.

FIG. 10F is a timing diagram of a program mode of operation according to an embodiment. FIG. 10F illustrates program operation in which TTJFET DRAM cell 700-33 is programmed (i.e. set to store data one). Although not shown, the deep n-well bias 706 and 726 for each TTJFET DRAM cell (700-11 to 700-66) can be commonly connected to a well bias voltage of 0.5 V.

In the timing diagram of FIG. 10F, it is assumed that initially, TTJFET DRAM cells (700-13, 700-23, 700-33, 700-43, 700-53, and 700-63) have a data state of "010001" and TTJFET DRAM cell 700-33 is to be programmed to a data one giving a state of "011001".

At time t0, all word line (WL1 to WL6), bit lines (BL1 to BL6), bias voltage lines (Vb1 to VB6), and source lines (SL1 to SL6) may be at zero volts in a standby state.

At time t1, word lines (WL1 to WL6) may transition to about 0.7 volts, bias line Vb3 may transition to about –1.0 volts. Also, at time t1, bit line BL3 and source line SL3 may transition to about a 0.5 volts while bit lines (BL1, BL2, BL4, BL5, and BL6) and source lines (SL1, SL2, SL4, SL5, and SL6) may maintain a ground potential (i.e. 0.0 volts). At about the same time, bias line Vb3 may transition to about –1.0 volts while bias lines (Vb1, Vb2, Vb4, Vb5, and Vb6) may be maintained at 0.2 volts or 0.0 volts.

In this way, the pn junction formed by the gate terminal 712 to drain terminal 716 of column of TTJFET DRAM cells (700-13, 700-23, 700-33, 700-43, 700-53, and 700-63) may be reverse biased to induce a punch through condition. Under this condition, the data storage regions 708 may have holes depleted therefrom and become negatively charged. A negatively charged data storage region 708 can induce a depletion region in the channel region such that the column of TTJFET DRAM cells (700-13, 700-23, 700-33, 700-43, 700-53, and 700-63) include a JFET DRAM cell 750 having a threshold voltage of about 0.4 volts. In this way, the JFET DRAM cell 750 may have a high impedance path between the drain terminal 716 and source terminal 714 with about a 0.2 volt bias on the respective word line (WL1 to WL6).

At time t2, all signals may return to the standby state.

At this time, TTJFET DRAM cells (700-13, 700-23, 700-33, 700-43, 700-53, and 700-63) have a programmed data state of "111111"

Next, a partial column erase may be performed to return TTJFET DRAM cells (700-13, 700-43, and 700-53) to logic zeros.

At time t3, word lines (WL2, WL3, and WL6) and source line SL3 may transition to about –0.3 volts while word lines (WL1, WL4, and WL5) may remain at 0.0 volts or ground. Also, at time t3, bias line Vb3 may transition to about 0.4 volts while bias lines (Vb1, Vb2, Vb4, Vb5, and Vb6) may remain at 0.0 volts or ground. In this way, the pn junction formed by the gate terminal 712 to source terminal 714 of TTJFET DRAM cells (700-13, 700-43, and 700-53) connected to bit line BL3 may be forward biased and holes injected into the channel region from the respective gate terminals 712 may be swept across the channel region and collected by the respective data storage regions 708. By doing so, data storage regions 708 of row of TTJFET DRAM cells (700-13, 70043, and 700-53) connected to bit line BL3 may be erased and may achieve a threshold voltage Vth of about –0.4 volts.

At time t4, all signals may return to the standby state and at this time TTJFET DRAM cells (700-13, 700-23, 700-33, 70043, 700-53, and 700-63) have a data state of "011001".

A read mode of operation will now be described.

Figure 10G:
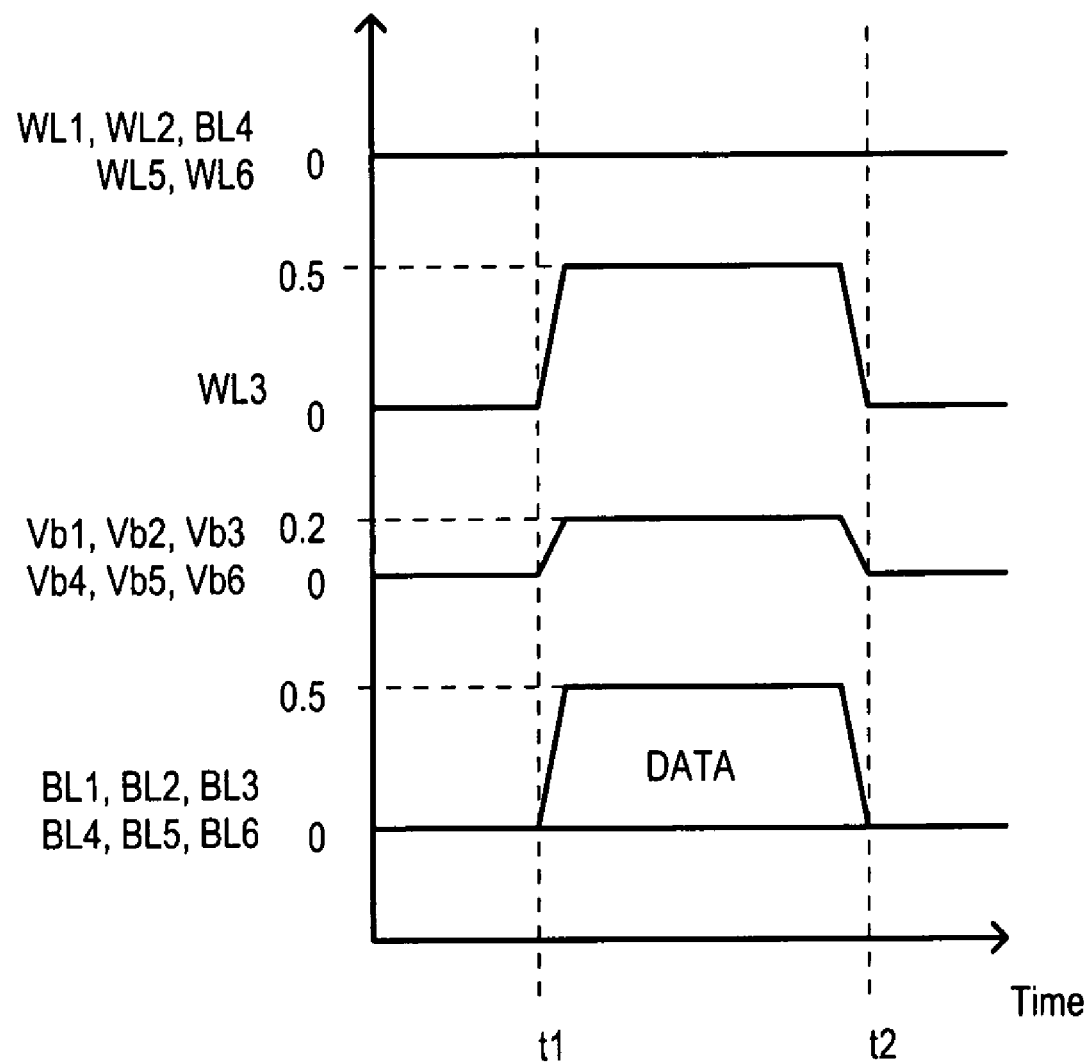
FIG. 10G is a timing diagram of a read mode of operation according to an embodiment.

A timing diagram illustrating a read operation in array of TTJFET DRAM cells 900 according to an embodiment is set forth in FIG. 10G. FIG. 10G illustrates reading the row of TTJFET DRAM cells (700-31 to 700-36) commonly connected to word line WL3.

At time t0, all word line (WL1 to WL6), bit lines (BL1 to BL6), bias voltage lines (Vb1 to VB6), and source lines (SL1 to SL6) may be at zero volts in a standby state. Alternatively, bias voltage lines (Vb1 to Vb6) may be at 0.2 volts in the standby state at time t0.

At time t1, word line WL3 may transition to 0.5 volts and bias voltage lines (Vb1 to Vb6) may transition to about 0.2 volts.

When word line WL3 transitions to 0.5 volts, each JFET access transistors 760 in row of TTJFET DRAM cells (700-31 to 700-36) commonly connected to word line WL3 may be turned on. With bias voltage lines (Vb1 to Vb6) at 0.2 volts, a JFET DRAM cell 750 in a TTJFET DRAM cell (700-11 to 700-66) storing a data one (i.e. the programmed state) may be turned off and a JFET DRAM cell 750 in a TTJFET DRAM cell (700-11 to 700-66) storing a data zero (i.e. the erased state) may be turned on. A TTJFET DRAM cell 700 in row of TTJFET DRAM cells (700-31 to 700-36) storing a data one may provide a high impedance between a bit line (BL1 to BL6) and respective source line (SL1 to SL6) and a TTJFET DRAM cell 700 in row of TTJFET DRAM cells (700-31 to 700-36) storing a data zero may provide a low impedance between a bit line (BL1 to BL6) and respective source line (SL1 to SL6). thus, a bit line (BL1 to BL6) may either be pulled high when a data one is stored or be pulled low, when a data zero is stored. A current sense scheme may be used to sense a low impedance state (i.e. the erased state) or a high impedance state (i.e. a programmed state) in which a voltage swing on bit lines (BL1 to BL6) may be small. In this way, data DATA may be placed on bit lines (BL1 to BL6) to be read out external to the semiconductor memory device.

At time t2, all word line (WL1 to WL6), bit lines (BL1 to BL6), bias voltage lines (Vb1 to VB6), and source lines (SL1 to SL6) may return to a standby state.

A refresh operation will now be discussed. The refresh operation can be a back ground refresh operation and may only affect TTJFET DRAM cells (700-11 to 700-66) storing a data one (i.e. the programmed state). A refresh operation may be performed by simply placing the bias voltage lines (Vb1 to Vb6) to 0.0 volts. With bias voltage lines (Vb1 to Vb6) at 0.0 volts, a relatively high reverse bias condition between the channel regions and data storage regions 708 that have been negatively charged (through previous programming or the like) may be created. Thus, only those TTJFET DRAM memory cells (700-11 to 300-66) may have their negative charge replenished.

Note, bias lines (Vb1 to Vb6) can have the same voltage (i.e. 0.0 volts) in a standby state and a refresh operation. By doing so, TTJFET DRAM memory cells (700-11 to 300-66) may be refreshed when the semiconductor memory device is in a standby state. This can prevent refresh from interfering in any way with any other operations. In this way, any other active mode of operation (read, program, or erase) may be entered with zero wait time when the semiconductor memory device including array of TTJFET DRAM cells (700-11 to 700-66) are currently being refreshed.

The refresh operation described above can be a true background refresh operation that has no effect on the operation timing of the semiconductor memory device including array of TTJFET DRAM cells (700-11 to 700-66).

An alternative embodiment for a TTJFET DRAM cell will now be described by referring to FIGS. 11A and 11B.

In FIG. 11A, a cross-sectional diagram of a TTJFET DRAM cell utilizing a JFET DRAM cell according to an embodiment is set forth and given the general reference character 1100a. In FIG. 11B, a circuit schematic diagram of a TTJFET DRAM cell utilizing a JFET DRAM cell according to an embodiment is set forth and given the general reference character 1100b.

Referring now to FIGS. 11A and 11B, the TTJFET DRAM cell (1100a and 1100b) utilizing a JFET DRAM cell can include a JFET DRAM cell 1150 and a JFET access transistor 1160.

The JFET DRAM cell 1150 is formed between two isolation regions 1104. Isolation regions 1104 can be formed with a shallow trench isolation (STI) method or the like. JFET DRAM cell 1150 can include a deep n-type well 1102 formed on a semiconductor substrate. A data storing region 1108 can be formed on the deep n-type well 1102. The data storing region 1108 can be formed by a p-well. A channel region 1110 can be formed on the data storing region 1108. The channel region 1110 can be a n-type doped region. JFET DRAM cell 1150 can include a source terminal 1114, a gate terminal 1112, and a drain terminal 1116. The source terminal 1114 and drain terminal 1116 can be formed from a n-type polysilicon layer and the gate terminal 1114 can be formed from a p-type polysilicon layer 1112. The deep n-type well 1102 can be electrically connected to a deep n-type well terminal (not shown) so that an electrical bias may be connected to the deep n-type well 1102.

The JFET access transistor 1160 is formed between two isolation regions 1104. Isolation regions 1104 can be formed with a shallow trench isolation (STI) method or the like. JFET access transistor 1160 can include a deep p-type well region 1103 on a semiconductor substrate. A channel region 1130 can be formed on the deep p-type well region 1103. The channel region 1130 can be a n-type doped region. JFET access transistor 1160 can include a source terminal 1134, a gate terminal 1132, and a drain terminal 1136. The source terminal 1134 and drain terminal 1136 can be formed from a n-type polysilicon layer and the gate terminal 1132 can be formed from a p-type polysilicon layer.

Referring now to FIG. 11C, a cross-sectional diagram of TTJFET DRAM cell 1100a along the gate electrode 1132 according to an embodiment is set forth. TTJFET DRAM cell 1100a and 1100b includes a single gate JFET access transistor 1160.

TTJFET DRAM cell (1100a and 1100b) can have an advantage by reducing leakage current as compared to JFET DRAM cell (100a and 100b). Furthermore, by providing JFET access transistor 1160, programming and erasing operations may have more margins as there is no need to worry about inadvertently conducting current through the JFET DRAM cell 1150.

The polysilicon layer that forms gate terminal 1132 of JFET access transistor 1160 can be used as a word line (WL), for example. Source terminal 1134 can be connected to a source voltage Vvss on a source line SL. The gate terminal 1112 of JFET DRAM cell 1150 can be connected to a bias voltage Vb. The drain terminal 1116 of JFET DRAM cell 1150 can be connected to a bit line BL. The bit line and word line can be orthogonal to each other. In this way, a bit line can connect a column of like TTJFET DRAM cells 1100a and a word line (WL) can connect a row of like TTJFET DRAM cells 1100a.

Referring to FIGS. 9 and 11B, TTJFET DRAM cell 100b can be used in an array of TTJFET DRAM cells 900. Furthermore, the operation of the array of TTJFET DRAM cells 900 using TTJFET DRAM cell 1100b can be essentially the same as illustrated in FIGS. 10A to 10G.

Yet another alternative embodiment for a TTJFET DRAM cell will now be described by referring to FIGS. 12A to 12C.

In FIG. 12A, a cross-sectional diagram of a TTJFET DRAM cell utilizing a JFET DRAM cell according to an embodiment is set forth and given the general reference character 1200a. In FIG. 12B, a circuit schematic diagram of a TTJFET DRAM cell utilizing a JFET DRAM cell according to an embodiment is set forth and given the general reference character 1200b.

Referring now to FIGS. 12A and 12B, the TTJFET DRAM cell (1200a and 1200b) utilizing a JFET DRAM cell can include a JFET DRAM cell 1250 and a JFET access transistor 1260. The JFET access transistor 1260 of FIGS. 12A and 12B is a single-gated p-channel JFET.

The JFET DRAM cell 1250 is formed between two isolation regions 1204. Isolation regions 1204 can be formed with a shallow trench isolation (STI) method or the like. JFET DRAM cell 1250 can include a data storage region 1208 formed on a deep n-type well 1202 between isolation regions 1204. The data storing region 1208 can be formed by a p-well. A channel region 1210 can be formed on the data storing region 1208. The channel region 1210 can be a n-type doped region. JFET DRAM cell 1250 can include a source terminal 1214, a gate terminal 1212, and a drain terminal 1216. The source terminal 1214 and drain terminal 1216 can be formed from an n-type polysilicon layer and the gate terminal 1212 can be formed from a p-type polysilicon layer. The deep n-type well 1202 can be electrically connected to a deep n-type well terminal (not shown) so that an electrical bias may be connected to the deep n-type well 1202.

The JFET access transistor 1260 is formed between two isolation regions 1204. Isolation regions 1204 can be formed with a shallow trench isolation (STI) method or the like. A channel region 1230 can be formed on the deep n-type well 1202 and between the isolation regions 1204. The channel region 1230 can be a p-type doped region. JFET access transistor 1260 can include a source terminal 1234, a gate terminal 1232, and a drain terminal 1236. The source terminal 1234 and drain terminal 1236 can be formed from a p-type polysilicon layer and the gate terminal 1232 can be formed from a n-type polysilicon layer.

Referring now to FIG. 12C, a cross-sectional diagram of TTJFET DRAM cell 1200a along the gate electrode 1232 according to an embodiment is set forth.

TTJFET DRAM cell (1200a and 1200b) can have an advantage by reducing leakage current as compared to JFET DRAM cell (100a and 100b). Furthermore, by providing JFET access transistor 1260, programming and erasing operations may have more margins as there is no need to worry about inadvertently conducting current through the JFET DRAM cell 1250.

The polysilicon layer that forms gate terminal 1232 of JFET access transistor 1260 can be used as a word line (WL), for example. Drain terminal 1216 of JFET DRAM cell 1250 can be connected to a bit line (BL). The bit line and word line can be orthogonal to each other. In this way, a bit line can connect a column of like TTJFET DRAM cells 1200a and a word line (WL) can connect a row of like TTJFET DRAM cells 1200*a*. The gate terminal 1212 of JFET DRAM cell 1250 can be connected to a bias voltage Vb. The source terminal 1214 of JFET DRAM cell 1250 can be connected to a source voltage Vvss on a source line SL.

It should be noted that the position of the JFET DRAM cell 1250 and the JFET access transistor 1260 may be interchangeable. In other words, the JFET DRAM cell 1250 may be positioned on the bottom of the stack and may be connected to source line SL while JFET access transistor 1260 may be positioned on the top of the stack and connected to the bit line BL.

Referring to FIGS. 9 and 12B, TTJFET DRAM cell 1200*b* can be used in an array of TTJFET DRAM cells 900. The operation of the array of TTJFET DRAM cells 900 using TTJFET DRAM cell 1200*b* can be similar to the timing diagrams as illustrated in FIGS. 10A to 10G, however, the polarity of the word line (WL1 to WL6) waveforms may be inverted due to the fact that JFET access transistor 1260 is a p-channel JFET.

It should be noted that multiple levels may be stored in TTJFET DRAM cells illustrated in the embodiments of FIGS. 1 to 12.

Memory devices discussed above, such as dynamic random access memories (DRAMs) access single entries according to applied addresses, however, other types of memory devices can provide a matching function with respect to all entries in the device. One such type of memory device is a content addressable memory (CAM) device.

CAMs provide a rapid comparison between a specific pattern of received data bits, commonly known as a search key or comparand, and data values stored in an associative CAM memory array to provide a match/no-match result. If there is a match for every bit in a group of stored bits in selected CAM memory cells, with every corresponding bit in the comparand, a match flag via a match line indicates a match condition. In this way, the user is notified that the data in the comparand was found in memory and a value corresponding to the match is returned. Thus, the result is determined from finding a matching value (content), not from providing the address of the value as done for a Random Access Memory (RAM).

Generally, there are two types of CAM cells typically used in CAM arrays: binary CAM cells and ternary CAM or TCAM cells.

Binary CAM cells store either a logic high bit value or a logic low bit value. When the logic value stored in the binary CAM cell matches a data bit from an applied comparand, then that CAM cell provides a high impedance path to the match line and the match line is maintained at a logic high value (assuming all other CAM cells electrically connected to the CAM array row also match). In this way, a match is indicated. However, when the logic value stored in the binary CAM cell does not match the data bit from the applied comparand, then that CAM cell provides a low impedance path to ground to the match line and the match line is pulled low. In this way, it is indicated that a match has not occurred.

TCAM cells can store three bit values including a logic high value, a logic low value, and a "don't care" value. When storing logic high and logic low values, the TCAM cell operates like a binary CAM cell as described above. However, a TCAM cell storing a "don't care" value will provide a match condition for any data bit value from a comparand applied to that TCAM cell. This "don't care" capability allows CAM arrays to indicate when a data value matches a selected group of TCAM cells in a row of the CAM array. For example, assume each row of a TCAM array has eight. TCAM cells. Additionally, assume that the first four TCAM cells of each row store one of a logic high and a logic low value (for comparison to the first four bits of an 8-bit comparand data value) and the last four TCAM cells of each row store "don't care" values. Under these conditions, when an 8-bit comparand data value is applied to the CAM array, a match occurs for each row of the CAM array in which the data values stored in the first four TCAM cells match the first four bits of the applied 8-bit comparand data value.

Figures 13, 14:
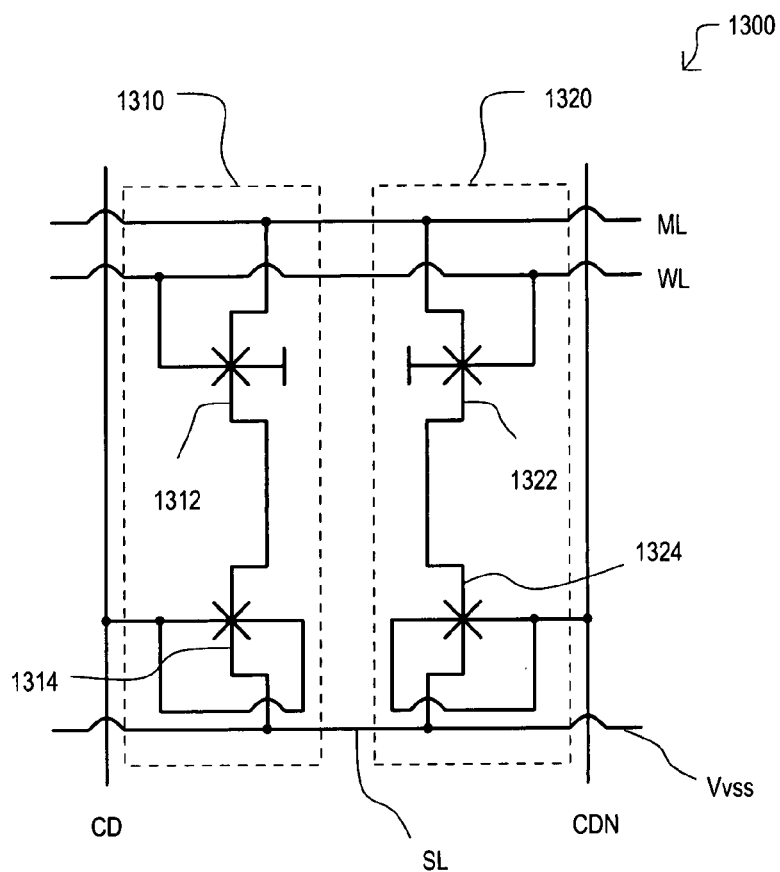
FIG. 13 is a circuit schematic diagram illustrating the use of a TTJFET DRAM cells as a ternary content addressable memory (TCAM) cell according to an embodiment.
FIG. 14 is a truth table illustrating whether there is a hit "match" or a miss on a match line for values stored in an X-cell and a Y-cell based on an input search key data.

Referring now to FIG. 13, a circuit schematic diagram illustrating the use of TTJFET DRAM cells 700*b* and 1100*b* as a ternary content addressable memory (TCAM) cell according to an embodiment is set forth and given the general reference character 1300.

TCAM cell 1300 can include a first TTJFET DRAM cell as an X-cell 1310 and a second TTJFET DRAM cell as a Y-cell 1320 connected in parallel between a match line ML and a source line SL. X-cell 1310 can receive a word line WL and a compare data CD as inputs. Y-cell 1320 can receive a word line WL and a compare data complement CDN as inputs.

The X-cell 1310 and Y-cell 1320 can be the same as any of TTJFET DRAM cells (700*a*, 700*b*, 100*a* and 100*b*) and may operate in the same manner.

X-cell 1310 can include a JFET DRAM cell 1312 and a JFET access transistor 1314. JFET DRAM cell 1312 can have a drain terminal connected to the match line ML, a gate terminal connected to a word line WL, and a source terminal commonly connected to a drain terminal of JFET access transistor 1314. JFET access transistor 1314 can have a front gate terminal and a optionally a back gate terminal commonly connected to receive compare data CD, and a source connected to a source line SL.

Y-cell 1320 can include a JFET DRAM cell 1322 and a JFET access transistor 1324. JFET DRAM cell 1322 can have a drain terminal connected to the match line ML, a gate terminal connected to a word line WL, and a source terminal commonly connected to a drain terminal of JFET access transistor 1324. JFET access transistor 1324 can have a front gate terminal and optionally a back gate terminal commonly connected to receive compare data complement CDN, and a source connected to a source line Vvss.

In this way, X-cell 1310 can form a first impedance path between a match line ML and a source line Vvss and Y-cell 1320 can form a second impedance path between a match line ML and a source line SL.

TCAM cell 1300 can have four different states. A first state is when X-cell 1310 and Y-cell 1320 are both erased (i.e. store zeros). A second state is when X-cell 1310 is erased and Y-cell 1320 is programmed. A third state is when X-cell 1310 is programmed and Y-cell 1320 is erased. A fourth state is when X-cell 1310 and Y-cell 1320 are both programmed (i.e. store ones).

The operation of TCAM cell 1300 will now be described with reference to FIG. 14. FIG. 14 is a truth table illustrating whether there is a hit "match" or a miss on match line ML for values stored in the X-cell 1310 and Y-cell 1320 based on an input search key data (data values on compare data line CD and compare data complement line CDN).

The truth table of FIG. 14 includes a X-cell value (a value stored in X-cell 1310), a Y-cell value (a value stored in Y-cell 1320), input search key (value compare data CD and compare data complement CDN), and a match output (output on match line ML).

When a compare is being performed on TCAM cell 1300, word line WL is at about 0.2 volts (note that word line WL corresponds to the bias line Vb in the TTJFET DRAM cell 700b). Also, in a compare operation, match line ML may be initially pre-charged to about 0.5 volts and source line SL may be at essentially 0.0 volts.

X-cell 1310 and Y-cell 1320 operate in the same manner as TTJFET DRAM cell 700b. An X-cell value or Y-cell value of "0" can be when X-cell 1310 or Y-cell 1320 stores an erased value. An X-cell value or Y-cell value of "1" can be when X-cell 1310 or Y-cell 1320 stores a programmed value.

With X-cell 1310 or Y-cell 1320 in an erased state, the respective X-cell 1310 or Y-cell 1320 having the erased state will have a low impedance path between the match line ML and source line SL when the respective compare data (CD or CDN) has a value of "1". With X-cell 1310 or Y-cell 1320 in an programmed state, the respective X-cell 1310 or Y-cell 1320 having the programmed state will have a high impedance path between the match line ML and source line SL no matter the value of compare data (CD or CDN).

When a "hit" occurs, the match line ML is not discharged and stays at a logic high value of 0.5 volts. When a "miss" occurs the match line ML is discharged through either the X-cell 1310 or Y-cell 1320 to the source line SL, which is at about 0.0 volts.

When X-cell 1310 has an X-cell value of "0" and Y-cell 1320 has a Y-cell value of "1", and compare data is a "0" (i.e. compare data CD is "0" and compare data complement CDN is "1"), a match output on match line ML can indicate a hit.

When X-cell 1310 has an X-cell value of "0" and Y-cell 1320 has a Y-cell value of "1", and compare data is a "1" (i.e. compare data CD is "1" and compare data complement CDN is "0"), a match output on match line ML can indicate a miss.

When X-cell 1310 has an X-cell value of "1" and Y-cell 1320 has a Y-cell value of "0", and compare data is a "0" (i.e. compare data CD is "0" and compare data complement CDN is "1"), a match output on match line ML can indicate a miss.

When X-cell 1310 has an X-cell value of "1" and Y-cell 1320 has a Y-cell value of "0", and compare data is a "1" (i.e. compare data CD is "1" and compare data complement CDN is "0"), a match output on match line ML can indicate a hit.

When X-cell 1310 has an X-cell value of "1" and Y-cell 1320 has a Y-cell value of "1", a match output on match line ML can indicate a hit no matter the value of complementary compare data (CD and CDN).

When X-cell 1310 has an X-cell value of "1" and Y-cell 1320 has a Y-cell value of "1", and compare data is a "1" (i.e. compare data CD is "1" and compare data complement CDN is "0"), a match output on match line ML can indicate a miss.

When X-cell 1310 has an X-cell value of "0" and Y-cell 1320 has a Y-cell value of "0", a match output on match line ML indicates a hit if complementary compare data (CD and CDN) are both "0", otherwise a miss is indicated.

However, if both compare data CD and compare data complement CDN have a value of "0", match line ML always indicates a hit.

Figure 15:
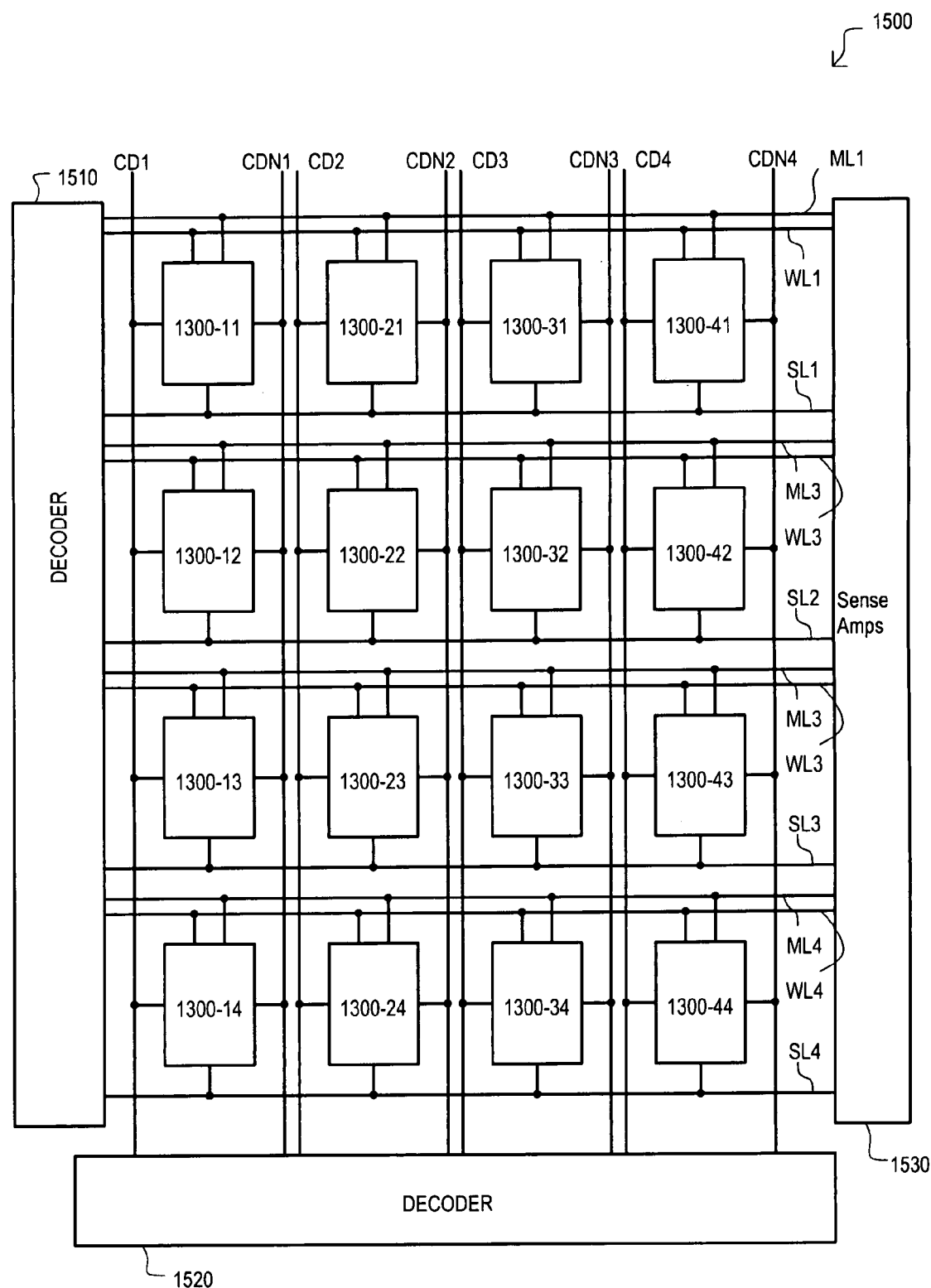
FIG. 15 is a circuit schematic diagram of a TCAM array according to an embodiment.

Referring now to FIG. 15, a circuit schematic diagram of a TCAM array according to an embodiment is set forth and given the general reference character 1500.

Only 16 TCAM cells (1300-11 to 1300-44) are shown in FIG. 15 to avoid unduly cluttering the figure, although a typical TCAM array 1500 may include millions of TCAM cells or more. TCAM array 1500 can include four rows and four columns of TCAM cells (1300-11 to 1300-44). TCAM array 1500 can be arranged in four groups of four bit words (1300-11 to 1300-41, 1300-12 to 1300-42, 1300-13 to 1300-43, and 1300-14 to 1300-44). TCAM array 1500 can include decoders (1510 and 1520) and sense amplifiers 1530.

Decoder 1510 can provide source lines (SL1 to SL4) and word lines (WL1 to WL4) to the TCAM cells (1300-11 to 1300-44). Decoder 1520 can provide complementary compare signals (CD1-CDN1 to CD4-CDN4) to TCAM cells (CD1-CDN1 to CD4-CDN4). Sense amplifiers 1530 can receive match lines (ML1 to ML4).

Source line SL1, word line WL1, and match line ML1 can be commonly connected to TCAM cells (1300-11 to 1300-41). Source line SL2, word line WL2, and match line ML2 can be commonly connected to TCAM cells (1300-12 to 1300-42). Source line SL3, word line WL3, and match line ML3 can be commonly connected to TCAM cells (1300-13 to 1300-43). Source line SL4, word line WL4, and match line ML4 can be commonly connected to TCAM cells (1300-41 to 1300-44).

Complementary compare signals (CD1 and CDN1) can be commonly connected to TCAM cells (1300-11 to 1300-41). Complementary compare signals (CD2 and CDN2) can be commonly connected to TCAM cells (1300-12 to 1300-42). Complementary compare signals (CD3 and CDN3) can be commonly connected to TCAM cells (1300-13 to 1300-43). Complementary compare signals (CD4 and CDN4) can be commonly connected to TCAM cells (1300-14 to 1300-44).

It should be noted that complementary compare signals (CD1-CDN1 to CD4-CDN4) may not always be complementary signals. For example, when bits are to be masked out, respective pairs of complementary compare signals (CD1-CDN1 to CD4-CDN4) may both be pulled low (i.e. a logic zero). By doing so, respective TCAM cells (1300-11 to 1300-44) may have their comparisons "masked".

As noted each TCAM cell (1300-11 to 1300-44) can essentially comprise two of the TTJFET DRAM cells 700b connected in parallel. Thus, for example, the array of TTJFET DRAM cells 900 illustrated in FIG. 9, can easily be turned into an array of TCAM cells that can search six 3-bit words in parallel. In this case, bias voltages (Vb1 to Vb6) become word lines (WL1 to WL6). Bit lines (BL1 to BL6) become match lines (ML1 to ML6), and word lines (WL1-WL2, WL3-WL4, and WL5-WL6) become complementary compare signals (CD1-CDN1, CD2-CDN2, and CD3-CDN3), respectively.

TCAM cells (1300-11 to 1300-44) can be programmed, erased, and refreshed in the same manner as illustrated in FIGS. 10A to 10G, by interchanging the bias voltages (Vb1 to Vb6), word lines (WL1 to WL6) and bit lines (BL1 to BL6) to become word lines (WL1 to WL6), complementary compare data (CD1 to CD4 and CDN1 to CDN4), and match lines (ML1 to ML6), as mentioned above.

When a TTJFET DRAM cell 700b is used in a TCAM configuration as illustrated in FIGS. 13 to 15, multiple cycles may be needed to read a word. For example, if a word is 32 bits (i.e. 32 bits along a match line ML), it can take 32 read cycles following the general read flow of FIG. 10G. In this case, a counter or the like may be connected to decoder 1520 of FIG. 15 to serially select bits stored in a word of TCAM cells (1300).

In converting from a DRAM configuration to a CAM configuration, DRAM rows become CAM columns an DRAM columns become CAM rows. Thus, when a read operation is performed on TCAM 1500, decoder 1520 acts to drive complementary compare data (CD and CDN) as a column multiplexer. However, in a search (compare) operation, decoder 1520 drives complementary compare data (CD and CDN) as the search data to be compared with the data stored in TCAM cells 1300.

In memory applications (DRAM applications), multiple levels may be stored in each TTJFET DRAM cell (100b, 700b, 1100b, and 1200b). This may be performed by having discrete charge storing levels, each having acceptable and non-overlapping windows of charge storage. In this way, threshold voltage ranges of the JFET DRAM cells (100b, 750b, 1150b, and 1250b) may be detected for multiple bit storage, such as 2 bits (4 states), 3 bits (8 states), 4 bits (16 states), etc.

Figures 16, 18:
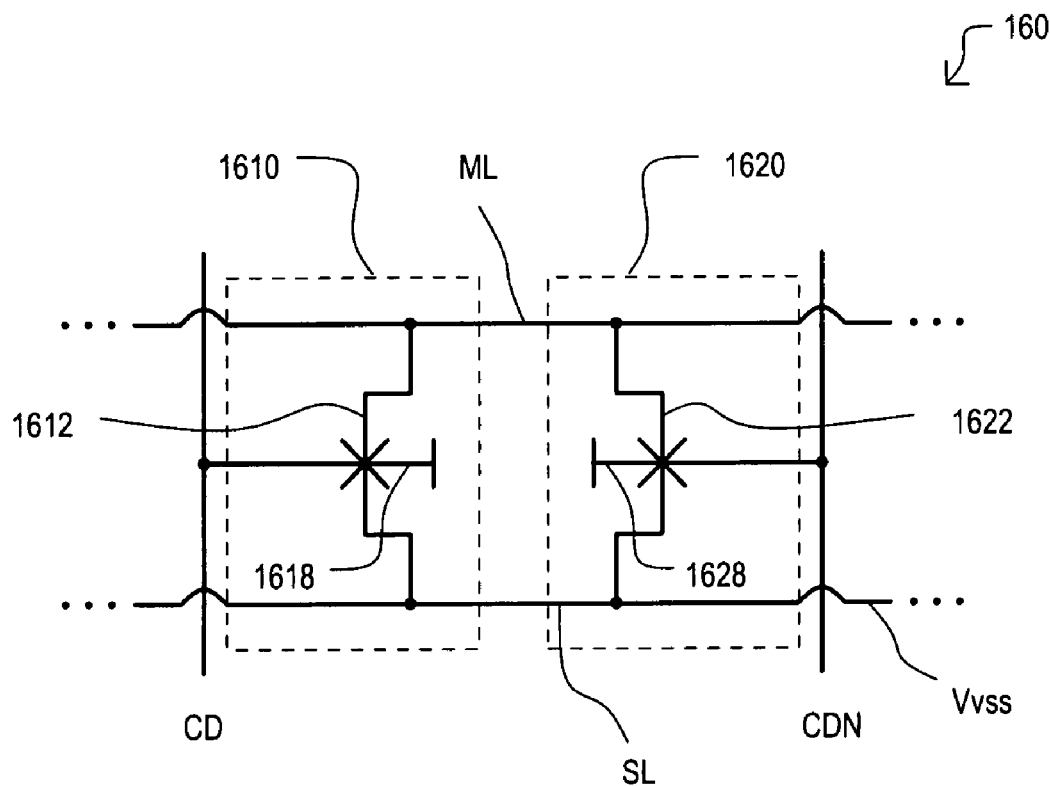
FIG. 16 is a circuit schematic diagram of a TCAM cell according to an embodiment.
FIG. 18 is a table illustrating the voltage applied (Vg) to a gate terminal, the voltage applied (Vd) to a drain terminal, the voltage applied (Vs) to a source terminal, and the voltage applied (Vwell) to a deep N-well for various operation modes of a JFET DRAM cell used in a TCAM cell according to an embodiment.

Referring now to FIG. 16, a circuit schematic diagram of a TCAM cell according to an embodiment is set forth and given the general reference character 1600.

TCAM cell 1600 can be formed from JFET DRAM cells, such as JFET DRAM cell 100b, as just one example.

TCAM cell 1600 can include a first JFET DRAM cell as an X-cell 1610 and a second JFET DRAM cell as a Y-cell 1620 connected in parallel between a match line ML and a source line SL. X-cell 1610 can receive a compare data CD as an input. Y-cell 1620 can receive a compare data complement CDN as an input.

The X-cell 1610 and Y-cell 1620 can be essentially the same as JFET DRAM cell (100a and 100b) and may operate in a similar manner. However, the data storage regions (1618 and 1628) in X-cell 1610 and Y-cell 1620 can operate as complete control back gates as will be explained below.

X-cell 1610 can include a JFET DRAM cell 1612. JFET DRAM cell 1612 can have a drain terminal connected to the match line ML, a gate terminal connected to receive compare data CD, and a source connected to a source line SL. JFET DRAM cell 1612 can include a data storage region 1618.

Y-cell 1620 can include a JFET DRAM cell 1622. JFET DRAM cell 1622 can have a drain terminal connected to the match line ML, a gate terminal connected to receive compare data complement CDN, and a source connected to a source line SL. JFET DRAM cell 1622 can include a data storage region 1628.

In this way, X-cell 1610 can form a first impedance path between a match line ML and a source line SL and Y-cell 1620 can form a second impedance path between a match line ML and a source line SL.

TCAM cell 1600 can have four different states. A first state is when X-cell 1610 and Y-cell 1620 are both erased (i.e. store zeros). A second state is when X-cell 1610 is erased and Y-cell 1620 is programmed. A third state is when X-cell 1610 is programmed and Y-cell 1620 is erased. A fourth state is when X-cell 1610 and Y-cell 1620 are both programmed (i.e. store ones). The operation of TCAM cell 1600 will now be described with reference to FIG. 14. FIG. 14 is a truth table illustrating whether there is a hit "match" or a miss on match line ML for values stored in the X-cell 1610 and Y-cell 1620 based on an input search key data (data values on compare data line CD and compare data complement line CDN).

The truth table of FIG. 14 includes a X-cell value (a value stored in X-cell 1610), a Y-cell value (a value stored in Y-cell 1620), input search key (value compare data CD and compare data complement CDN), and a match output (output on match line ML).

When a compare is being performed on TCAM cell 1600, match line ML may be initially pre-charged to about 0.1 volts and source line SL may be at essentially 0.0 volts.

An X-cell value or Y-cell value of "0" can be when X-cell 1610 or Y-cell 1620 stores an erased value. An X-cell value or Y-cell value of "1" can be when X-cell 1610 or Y-cell 1620 stores a programmed value.

X-cell 1610 and Y-cell 1620 operate in a similar manner as JFET DRAM cell 100b. With X-cell and Y-cell 1620, when either JFET DRAM cell (1612 or 1622) store a "one" (i.e. is in the programmed state), a high impedance path remains between the respective drain and source even if the gate potential is 0.5 volts. In effect, the data storage regions (1618 and 1628) act as a back control gate to keep the respective channels turned off.

With X-cell 1610 or Y-cell 1620 in an erased state, the respective X-cell 1610 or Y-cell 1620 having the erased state will have a low impedance path between the match line ML and source line SL when the respective compare data (CD or CDN) has a value of "1".

With X-cell 1610 or Y-cell 1620 in a programmed state, the respective X-cell 1610 or Y-cell 1620 having the programmed state will have a high impedance path between the match line ML and source line SL no matter the value of compare data (CD or CDN).

Thus, the data storage regions (1618 and 1628) can operate to change the threshold voltage of the respective JFET DRAM cell (1612 or 1622) forming the X-cell 1610 and Y-cell 1620.

When a "hit" occurs, the match line ML is not discharged and stays at a logic high value of 0.1 volts. When a "miss" occurs the match line ML is discharged through either the X-cell 1610 or Y-cell 1620 to the source line SL, which is at about 0.0 volts.

When X-cell 1610 has an X-cell value of "0" and Y-cell 1620 has a Y-cell value of "1", and compare data is a "0" (i.e. compare data CD is "0" and compare data complement CDN is "1"), a match output on match line ML can indicate a hit.

When X-cell 1610 has an X-cell value of "0" and Y-cell 1620 has a Y-cell value of "1", and compare data is a "1" (i.e. compare data CD is "1" and compare data complement CDN is "0"), a match output on match line ML can indicate a miss.

When X-cell 1610 has an X-cell value of "1" and Y-cell 1620 has a Y-cell value of "0", and compare data is a "0" (i.e. compare data CD is "0" and compare data complement CDN is "1"), a match output on match line ML can indicate a miss.

When X-cell 1610 has an X-cell value of "1" and Y-cell 1620 has a Y-cell value of "0", and compare data is a "1" (i.e. compare data CD is "1" and compare data complement CDN is "0"), a match output on match line ML can indicate a hit.

When X-cell 1610 has an X-cell value of "1" and Y-cell 1620 has a Y-cell value of "1", a match output on match line ML can indicate a hit no matter the value of complementary compare data (CD and CDN).

When X-cell 1610 has an X-cell value of "1" and Y-cell 1620 has a Y-cell value of "1", and compare data is a "1" (i.e. compare data CD is "1" and compare data complement CDN is "0"), a match output on match line ML can indicate a miss.

When X-cell 1610 has an X-cell value of "0" and Y-cell 1620 has a Y-cell value of "0", a match output on match line ML indicates a hit if complementary compare data (CD and CDN) are both "0", otherwise a miss is indicated.

However, if both compare data CD and compare data complement CDN have a value of "0", match line ML always indicates a hit.

Figure 17:
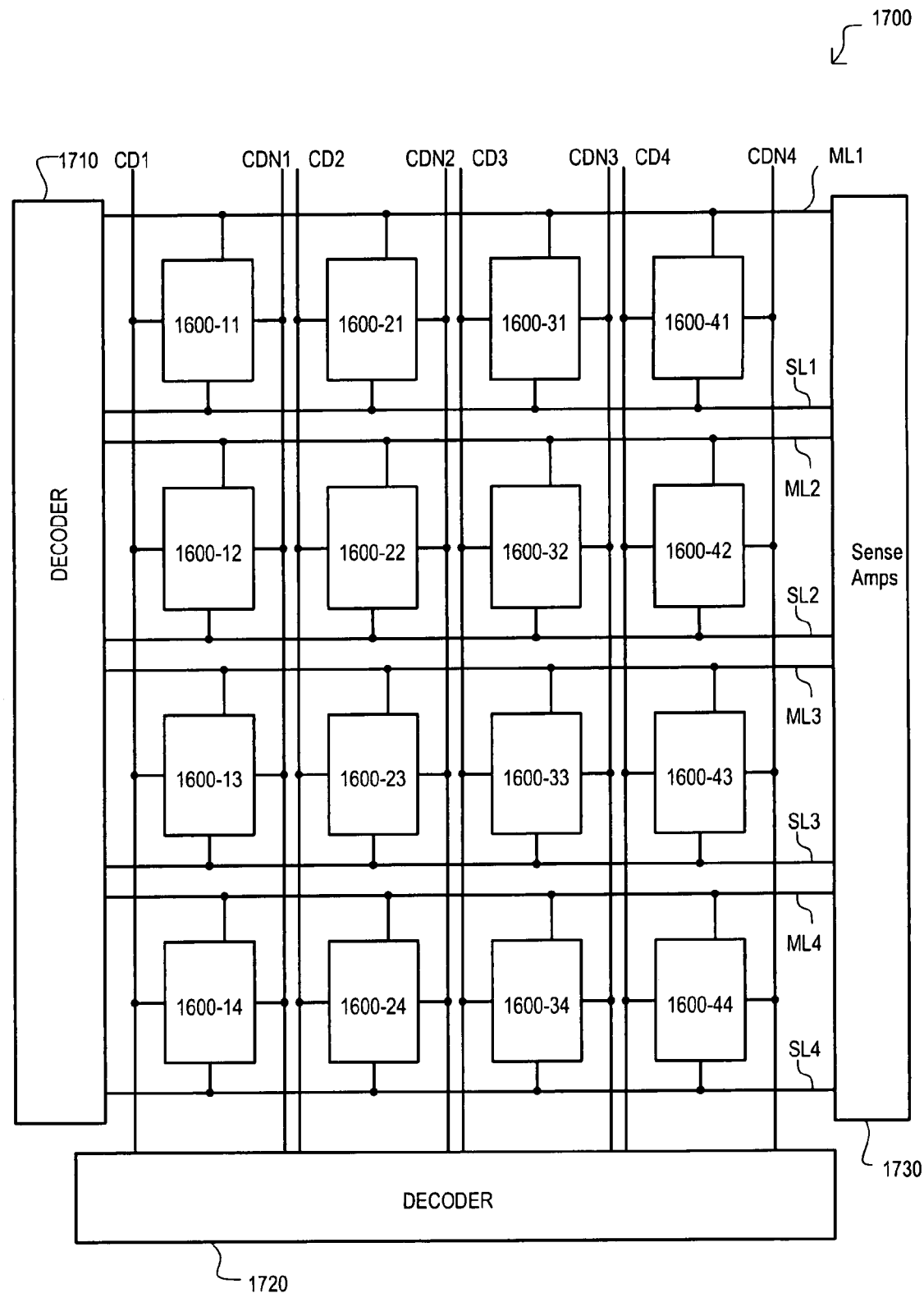
FIG. 17 is a circuit schematic diagram of a TCAM array according to an embodiment.

Referring now to FIG. 17, a circuit schematic diagram of a TCAM array according to an embodiment is set forth and given the general reference character 1700.

Only 16 TCAM cells (1600-11 to 1600-44) are shown in FIG. 17 to avoid unduly cluttering the figure, although a typical TCAM array 1700 may include millions of TCAM cells or more. TCAM array 1700 can include four rows and four columns of TCAM cells (1600-11 to 1600-44). TCAM array 1700 can be arranged in four groups of four bit words (1600-11 to 1600-41, 1600-12 to 1600-42, 1600-13 to 1600-43, and 1600-14 to 1600-44). TCAM array 1700 can include decoders (1710 and 1720) and sense amplifiers 1730.

Decoder 1710 can provide source lines (SL1 to SL4) to the TCAM cells (1600-11 to 1600-44). Decoder 1720 can provide complementary compare signals (CD1-CDN1 to CD4-CDN4) to TCAM cells (1600-11 to 1600-44). Sense amplifiers 1730 can receive match lines (ML1 to ML4).

Source line SL1 and match line ML1 can be commonly connected to TCAM cells (1600-11 to 1600-41). Source line SL2 and match line ML2 can be commonly connected to TCAM cells (1600-12 to 1600-42). Source line SL3 and match line ML3 can be commonly connected to TCAM cells (1600-13 to 1600-43). Source line SL4 and match line ML4 can be commonly connected to TCAM cells (1600-41 to 1600-44).

Complementary compare signals (CD1 and CDN1) can be commonly connected to TCAM cells (1600-11 to 1600-14). Complementary compare signals (CD2 and CDN2) can be commonly connected to TCAM cells (1600-21 to 1600-24). Complementary compare signals (CD3 and CDN3) can be commonly connected to TCAM cells (1600-31 to 1600-34). Complementary compare signals (CD4 and CDN4) can be commonly connected to TCAM cells (1600-41 to 1600-44).

As noted each TCAM cell (1600-11 to 1600-44) can essentially comprise two of the JFET DRAM cells 100b connected in parallel. Thus, for example, the array of TTJFET DRAM cells 300 illustrated in FIG. 3 can easily be turned into an array of TCAM cells 1700. In this case bit lines (BL1 to BL3) become match lines (ML1 to ML3), and word lines (WL1-WL3) become complementary compare signals (CD1-CDN1, CD2), respectively and so on.

TCAM cells (1600-11 to 1600-44) can be programmed, erased, and refreshed in the same manner as illustrated in FIGS. 4A to 4D, by interchanging word lines (WL1 to WL6) and bit lines (BL1 to BL6) to become word lines (WL1 to WL6), match lines (ML1 to ML6) complementary compare data (CD1 to CD4 and CDN1 to CD4), as mentioned above and using the voltage levels as shown in FIG. 17.

Referring now to FIG. 18, a table illustrating the voltage applied (Vg) to a gate terminal 112, the voltage applied (Vd) to a drain terminal 116, the voltage applied (Vs) to the source terminal 114, and the voltage applied (Vwell) to the deep N-well 106 for each of the four above-mentioned operation modes when using JFET DRAM cell 100b of FIG. 1B as an X-cell 1610 and Y-cell 1620 of a TCAM cell 1600 are set forth. In the erase mode of operation, the gate terminal 112 may have a gate voltage Vg=0.4 V, the drain terminal 116 may have a drain voltage Vd=−0.3 V, the source terminal 114 may have a source voltage Vs=0.0 V or −0.3 V, and the deep n-well terminal 106 may have a well voltage Vwell=0.5 V. In the program mode of operation, the gate terminal 112 may have a gate voltage Vg=−1.0 V, the drain terminal 116 may have a drain voltage Vd=0.5 V, the source terminal 114 may have a source voltage Vs=0.0 V or 0.5 V, and the deep n-well terminal 106 may have a well voltage Vwell=0.5 V. In the read mode of operation, the gate terminal 112 may have a gate voltage Vg=0.5 V, the drain terminal 116 may have a drain voltage Vd=0.1 V, the source terminal 114 may have a source voltage Vs=0.0 V, and the deep n-well terminal 106 may have a well voltage Vwell=0.5 V. In the refresh mode of operation, the gate terminal 112 may have a gate voltage Vg=0.0 V, the drain terminal 116 may have a drain voltage Vd=0.0 V, the source terminal 114 may have a source voltage Vs=0.0 V, and the deep n-well terminal 106 may have a well voltage Vwell=0.5 V.

When a JFET DRAM cell 100b is used in a TCAM configuration as illustrated in FIGS. 13 to 15, multiple cycles may be needed to read a word. For example, if a word is 32 bits (i.e. 32 bits along a match line ML), it can take 32 read cycles following the general read flow of FIG. 4C using the voltages of FIG. 18. In this case, a counter or the like may be connected to decoder 1720 of FIG. 17 to serially select bits stored in a word of TCAM cells (1600).

In converting from a DRAM configuration to a CAM configuration, DRAM rows become CAM columns and DRAM columns become CAM rows. Thus, when a read operation is performed on TCAM 1700, decoder 1720 acts to drive complementary compare data (CD and CDN) as a column multiplexer. However, in a search (compare) operation, decoder 1720 drives complementary compare data (CD and CDN) as the search data to be compared with the data stored in TCAM cells 1600.

In memory applications (DRAM applications), multiple levels may be stored in each JFET DRAM cell 100b. This may be performed by having discrete charge storing levels, each having acceptable and non-overlapping windows of charge storage. In this way, threshold voltage ranges of the JFET DRAM cells 100b may be detected for multiple bit storage, such as 2 bits (4 states), 3 bits (8 states), 4 bits (16 states), etc.

In the embodiments, a memory cell includes a JFET having a data storage region disposed in a substrate and between two insulating regions, such as a shallow trench insulation (STI). The data storage region can provide a first threshold voltage to the JFET when storing a first data value and provide a second threshold voltage to the JFET when storing a second data value. The memory cell is a dynamic random access memory (DRAM) cell and can be used to form a content addressable memory (CAM) cell.

Yet another alternative embodiment for a TTJFET DRAM cell will now be described by referring to FIGS. 19A to 19C.

In FIG. 19A, a cross-sectional diagram of a TTJFET DRAM cell utilizing a JFET DRAM cell according to an embodiment is set forth and given the general reference character 1900a. In FIG. 19B, a circuit schematic diagram of a TTJFET DRAM cell utilizing a JFET DRAM cell according to an embodiment is set forth and given the general reference character 1900b.

Referring now to FIGS. 19A and 19B, the TTJFET DRAM cell (1900a and 1900b) utilizing a JFET DRAM cell can include a JFET DRAM cell 1950 and a JFET access transistor 1960. The JFET access transistor 1260 of FIGS. 12A and 12B is a single-gated n-channel JFET.

The JFET DRAM cell 1950 is formed between two isolation regions 1904. Isolation regions 1904 can be formed with a shallow trench isolation (STI) method or the like. JFET DRAM cell 1950 can include an n-well 1906 formed on a deep p-type well 1902. A data storage region 1908 can be formed on n-well 1906 between isolation regions 1904. The data storing region 1908 can be formed by a p-well. A channel region 1910 can be formed on the data storing region 1908. The channel region 1910 can be a n-type doped region. JFET DRAM cell 1950 can include a source terminal 1914, a gate terminal 1912, and a drain terminal 1916. The source terminal 1914 and drain terminal 1916 can be formed from an n-type polysilicon layer and the gate terminal 1912 can be formed from a p-type polysilicon layer.

JFET DRAM cell 1950 can include an n-type diffusion region 1915 providing an electrical connection between the source terminal 1914 and the n-well 1906. In this way, a voltage applied to the source terminal 1914 can be transmitted to n-well 1906 and have a greater influence on data storage region so that programming and erasing efficiency may be improved. N-well 1906 is a first diffusion region under the data storage region 1908 and having opposite conductivity type as the data storage region 1908.

The deep p-type well 1902 can be electrically connected to a deep p-type well terminal (not shown) so that an electrical bias may be connected to the deep p-type well 1902.

The JFET access transistor 1960 is formed between two isolation regions 1904. Isolation regions 1904 can be formed with a shallow trench isolation (STI) method or the like. A channel region 1930 can be formed on the deep p-type well 1902 and between the isolation regions 1904. The channel region 1930 can be a n-type doped region. JFET access transistor 1960 can include a source terminal 1934, a gate terminal 1932, and a drain terminal 1936. The source terminal 1934 and drain terminal 1936 can be formed from a n-type polysilicon layer and the gate terminal 1932 can be formed from a p-type polysilicon layer.

Referring now to FIG. 19C, a cross-sectional diagram of TTJFET DRAM cell 1900a along the gate electrode 1932 according to an embodiment is set forth.

TTJFET DRAM cell (1900a and 1900b) can have an advantage by reducing leakage current as compared to JFET DRAM cell (100a and 100b). Furthermore, by providing JFET access transistor 1960, programming and erasing operations may have more margins as there is no need to worry about inadvertently conducting current through the JFET DRAM cell 1950.

The polysilicon layer that forms gate terminal 1932 of JFET access transistor 1960 can be used as a word line (WL), for example. Drain terminal 1916 of JFET DRAM cell 1950 can be connected to a bit line (BL). The bit line and word line can be orthogonal to each other. In this way, a bit line can connect a column of like TTJFET DRAM cells 1900a and a word line (WL) can connect a row of like TTJFET DRAM cells 1900a. The gate terminal 1912 of JFET DRAM cell 1950 can be connected to a bias voltage Vb. The source terminal 1914 of JFET DRAM cell 1950 can be connected to a source voltage Vvss on a source line SL.

Referring to FIGS. 9 and 19B, TTJFET DRAM cell 1900b can be used in an array of TTJFET DRAM cells 900. The operation of the array of TTJFET DRAM cells 900 using TTJFET DRAM cell 1900b can be similar to the timing diagrams as illustrated in FIGS. 10A to 10G.

TTJFET DRAM cell 1900a and 1900b may be used in a Ternary TCAM cell as illustrated in FIGS. 13-15.

The semiconductor devices of the embodiments may be manufactured in accordance with known process steps. Examples of known process steps for manufacture of the JFETs set forth in the embodiments are shown in U.S. patent application Ser. No. 11/507,793 filed Aug. 22, 2006 and U.S. patent application Ser. No. 11/261,873 filed Oct. 28, 2005. The contents of both are incorporated herein by reference.

Reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is an inventive feature of the invention may include an elimination of an element.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:
a content addressable memory (CAM) cell including
a first junction field effect transistor (JFET) and a second JFET coupled in series between a match line and a source line;
wherein the first JFET includes a programmable threshold voltage.

2. The semiconductor device of claim 1, wherein:
the first JFET has a first JFET drain terminal and a first JFET source terminal, the first JFET drain terminal is coupled to the match line; and
the second JFET has a second JFET drain terminal and a second JFET source terminal, the first JFET source terminal is coupled to the second JFET drain terminal and the second JFET source terminal is coupled to the source line.

3. The semiconductor device of claim 2, wherein:
the second JFET includes a second JFET gate terminal coupled to receive compare data.

4. The semiconductor device of claim 3, wherein:
the CAM cell is a ternary CAM cell and further includes a third JFET and a fourth JFET coupled in series between a match line and the source line.

5. The semiconductor device of claim 4, wherein:
the third JFET has a third JFET drain terminal and a third JFET source terminal, the third JFET drain terminal is coupled to the match line; and
the fourth JFET has a fourth JFET drain terminal and a fourth JFET source terminal, the third JFET source terminal is coupled to the fourth JFET drain terminal and the fourth JFET source terminal is coupled to the source line.

6. The semiconductor device of claim 5, wherein:
the fourth JFET includes a fourth JFET gate terminal coupled to receive compare data complement.

7. The semiconductor device of claim 1, wherein:
the first JFET includes a data storage region.

8. The semiconductor device of claim 7, wherein:
the data storage region provides a first threshold voltage to the first JFET when storing a first data value and provides a second threshold voltage to the first JFET when storing a second data value.

9. The semiconductor device of claim 7 wherein the data storage region is formed between and in contact with a first and second trench isolation region.

10. The semiconductor device of claim 1, wherein:
the first JFET includes a first JFET gate terminal coupled to a word line.

11. A semiconductor device, comprising:
a content addressable memory (CAM) cell including
a first junction field effect transistor (JFET) having a programmable threshold voltage and coupled between a match line and a source line.

12. The semiconductor device of claim 11, wherein:
the first JFET includes a first JFET drain coupled to the match line and a first JFET source coupled to the source line.

13. The semiconductor device of claim 12, wherein:
the first JFET includes a first JFET gate coupled to receive compare data.

14. The semiconductor device of claim 13, wherein:
the CAM cell is a ternary CAM cell and further includes a second JFET having a programmable threshold voltage and coupled in parallel with the first JFET between the match line and the source line.

15. The semiconductor device of claim 14, wherein:
the second JFET includes a second JFET drain coupled to the match line and a second JFET source coupled to the source line.

16. The semiconductor device of claim 15, wherein:
the second JFET includes a second JFET gate coupled to receive compare data complement.

17. The semiconductor device of claim 11, wherein:
the first JFET includes a first data storage region.

18. The semiconductor device of claim 17, wherein:
the first data storage region provides a first threshold voltage to the first JFET when storing a first data value and provides a second threshold voltage to the first JFET when storing a second data value.

19. The semiconductor device of claim 17, wherein:
the first data storage region is sandwiched between and in contact with a first and second trench isolation region.

20. The semiconductor device of claim 17, wherein:
the first JFET includes a channel region having a first conductivity type and the data storage region has a second conductivity type.

21. The semiconductor device of claim 11, wherein:
the first JFET includes a control gate and data storage region, the data storage region operates as a back control gate to control an impedance path between a first JFET drain and a first JFET source.

* * * * *